(12) United States Patent
Rigg et al.

(10) Patent No.: US 7,759,800 B2
(45) Date of Patent: Jul. 20, 2010

(54) MICROELECTRONICS DEVICES, HAVING VIAS, AND PACKAGED MICROELECTRONIC DEVICES HAVING VIAS

(75) Inventors: Sidney B. Rigg, Meridian, ID (US);
Charles M. Watkins, Eagle, ID (US);
Kyle K. Kirby, Boise, ID (US); Peter A. Benson, Boise, ID (US); Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/430,735

(22) Filed: May 9, 2006

(65) Prior Publication Data
US 2006/0216862 A1 Sep. 28, 2006

Related U.S. Application Data

(62) Division of application No. 10/713,878, filed on Nov. 13, 2003, now Pat. No. 7,091,124.

(51) Int. Cl.
*H01L 23/48* (2006.01)
*H01L 23/52* (2006.01)
*H01L 29/40* (2006.01)

(52) U.S. Cl. .............................. 257/774; 257/E21.577; 257/E23.011

(58) Field of Classification Search .................. 257/774, 257/E21.577, E23.011
See application file for complete search history.

(56) References Cited

U.S. PATENT DOCUMENTS

| | | | |
|---|---|---|---|
| 2,821,959 A | 2/1958 | Franz | |
| 3,006,318 A | 10/1961 | Monroe, Jr. et al. | |
| 3,345,134 A | 10/1967 | Heymer et al. | |
| 3,865,298 A | 2/1975 | Allen et al. | |

(Continued)

FOREIGN PATENT DOCUMENTS

EP 0127946 12/1984

(Continued)

OTHER PUBLICATIONS

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

(Continued)

*Primary Examiner*—Howard Weiss
(74) *Attorney, Agent, or Firm*—Perkins Coie LLP

(57) ABSTRACT

Microelectronic devices, methods for packaging microelectronic devices, and methods for forming vias and conductive interconnects in microfeature workpieces and dies are disclosed herein. In one embodiment, a method includes forming a bond-pad on a die having an integrated circuit, the bond-pad being electrically coupled to the integrated circuit. A conductive line is then formed on the die, the conductive line having a first end portion attached to the bond-pad and a second end portion spaced apart from the bond-pad. The method can further include forming a via or passage through the die, the bond-pad, and the first end portion of the conductive line, and depositing an electrically conductive material in at least a portion of the passage to form a conductive interconnect extending at least generally through the microelectronic device.

22 Claims, 8 Drawing Sheets

U.S. PATENT DOCUMENTS

| | | |
|---|---|---|
| 3,902,036 A | 8/1975 | Zaleckas |
| 4,040,168 A | 8/1977 | Huang |
| 4,368,106 A | 1/1983 | Anthony |
| 4,534,100 A | 8/1985 | Lane |
| 4,581,301 A | 4/1986 | Michaelson |
| 4,608,480 A | 8/1986 | Bizot et al. |
| 4,614,427 A | 9/1986 | Koizumi et al. |
| 4,627,971 A | 12/1986 | Ayer |
| 4,660,063 A | 4/1987 | Anthony |
| 4,756,765 A | 7/1988 | Woodroffe |
| 4,768,291 A | 9/1988 | Palmer |
| 4,959,705 A | 9/1990 | Lemnios et al. |
| 4,964,212 A | 10/1990 | Deroux-Dauphin et al. |
| 4,984,597 A | 1/1991 | McConnell et al. |
| 5,024,966 A | 6/1991 | Dietrich et al. |
| 5,026,964 A | 6/1991 | Somers et al. |
| 5,027,184 A | 6/1991 | Soclof |
| 5,037,782 A | 8/1991 | Nakamura et al. |
| 5,107,328 A | 4/1992 | Kinsman |
| 5,123,902 A | 6/1992 | Muller et al. |
| 5,128,831 A | 7/1992 | Fox, III et al. |
| 5,138,434 A | 8/1992 | Wood et al. |
| 5,145,099 A | 9/1992 | Wood et al. |
| 5,158,911 A | 10/1992 | Quentin et al. |
| 5,219,344 A | 6/1993 | Yoder, Jr. |
| 5,233,448 A | 8/1993 | Wu et al. |
| 5,237,148 A | 8/1993 | Aoki et al. |
| 5,252,857 A | 10/1993 | Kane et al. |
| 5,289,631 A | 3/1994 | Koopman et al. |
| 5,292,686 A | 3/1994 | Riley et al. |
| 5,294,568 A | 3/1994 | McNeilly et al. |
| 5,378,312 A | 1/1995 | Gifford et al. |
| 5,380,681 A * | 1/1995 | Hsu ............................ 438/109 |
| 5,402,435 A | 3/1995 | Shiono et al. |
| 5,406,630 A | 4/1995 | Piosenka et al. |
| 5,424,573 A | 6/1995 | Kato et al. |
| 5,438,212 A | 8/1995 | Okaniwa et al. |
| 5,447,871 A | 9/1995 | Goldstein |
| 5,464,960 A | 11/1995 | Hall et al. |
| 5,496,755 A | 3/1996 | Bayraktaroglu |
| 5,515,167 A | 5/1996 | Ledger et al. |
| 5,518,956 A | 5/1996 | Liu et al. |
| 5,518,957 A | 5/1996 | Kim |
| 5,585,308 A | 12/1996 | Sardella |
| 5,585,675 A | 12/1996 | Knopf |
| 5,593,927 A | 1/1997 | Farnworth |
| 5,614,743 A | 3/1997 | Mochizuki et al. |
| 5,624,437 A | 4/1997 | Freeman et al. |
| 5,627,106 A | 5/1997 | Hsu et al. |
| 5,646,067 A | 7/1997 | Gaul |
| 5,654,221 A | 8/1997 | Cronin et al. |
| 5,673,846 A | 10/1997 | Gruber |
| 5,677,566 A | 10/1997 | King et al. |
| 5,684,642 A | 11/1997 | Zumoto et al. |
| 5,690,841 A | 11/1997 | Elderstig et al. |
| 5,718,791 A | 2/1998 | Spengler et al. |
| 5,723,904 A | 3/1998 | Shiga et al. |
| 5,726,493 A | 3/1998 | Yamashita et al. |
| 5,771,158 A | 6/1998 | Yamagishi et al. |
| 5,773,359 A | 6/1998 | Mitchell et al. |
| 5,776,824 A | 7/1998 | Farnworth et al. |
| 5,807,439 A | 9/1998 | Akatsu et al. |
| 5,811,799 A | 9/1998 | Wu |
| 5,821,532 A | 10/1998 | Beaman et al. |
| 5,825,080 A | 10/1998 | Imaoka et al. |
| 5,826,628 A | 10/1998 | Hamilton |
| 5,847,454 A | 12/1998 | Shaw et al. |
| 5,851,845 A | 12/1998 | Wood et al. |
| 5,857,963 A | 1/1999 | Pelchy et al. |
| 5,861,654 A | 1/1999 | Johnson |
| 5,870,289 A | 2/1999 | Tokuda et al. |
| 5,870,823 A | 2/1999 | Bezama et al. |
| 5,883,426 A | 3/1999 | Tokuno et al. |
| 5,891,797 A | 4/1999 | Farrar |
| 5,893,828 A | 4/1999 | Uram |
| 5,904,499 A | 5/1999 | Pace |
| 5,925,930 A | 7/1999 | Farnworth et al. |
| 5,933,713 A | 8/1999 | Farnworth |
| 5,938,956 A | 8/1999 | Hembree et al. |
| 5,946,553 A | 8/1999 | Wood et al. |
| 5,986,209 A | 11/1999 | Tandy |
| 5,990,566 A | 11/1999 | Farnworth et al. |
| 5,998,240 A | 12/1999 | Hamilton et al. |
| 5,998,292 A | 12/1999 | Black et al. |
| 6,004,867 A | 12/1999 | Kim et al. |
| 6,008,070 A | 12/1999 | Farnworth |
| 6,008,914 A | 12/1999 | Sasagawa et al. |
| 6,018,249 A | 1/2000 | Akram et al. |
| 6,020,624 A | 2/2000 | Wood et al. |
| 6,020,629 A | 2/2000 | Farnworth et al. |
| 6,028,365 A | 2/2000 | Akram et al. |
| 6,048,755 A | 4/2000 | Jiang et al. |
| 6,051,878 A | 4/2000 | Akram et al. |
| 6,066,514 A | 5/2000 | King et al. |
| 6,072,233 A | 6/2000 | Corisis et al. |
| 6,072,236 A | 6/2000 | Akram et al. |
| 6,080,291 A | 6/2000 | Woodruff et al. |
| 6,081,429 A | 6/2000 | Barrett |
| 6,089,920 A | 7/2000 | Farnworth et al. |
| 6,097,087 A * | 8/2000 | Farnworth et al. ............ 257/698 |
| 6,103,547 A | 8/2000 | Corisis et al. |
| 6,107,122 A | 8/2000 | Wood et al. |
| 6,107,180 A | 8/2000 | Munroe et al. |
| 6,107,679 A | 8/2000 | Noguchi et al. |
| 6,110,825 A | 8/2000 | Mastromatteo et al. |
| 6,114,240 A | 9/2000 | Akram et al. |
| 6,119,335 A | 9/2000 | Park et al. |
| 6,124,634 A | 9/2000 | Akram et al. |
| 6,130,141 A | 10/2000 | Degani et al. |
| 6,130,474 A | 10/2000 | Corisis |
| 6,133,622 A | 10/2000 | Corisis et al. |
| 6,137,182 A | 10/2000 | Hause et al. |
| 6,140,604 A | 10/2000 | Somers et al. |
| 6,143,588 A | 11/2000 | Glenn |
| 6,148,509 A | 11/2000 | Schoenfeld et al. |
| 6,150,717 A | 11/2000 | Wood et al. |
| 6,153,924 A | 11/2000 | Kinsman |
| 6,159,764 A | 12/2000 | Kinsman et al. |
| 6,175,149 B1 | 1/2001 | Akram |
| 6,180,518 B1 | 1/2001 | Layadi et al. |
| 6,184,465 B1 | 2/2001 | Corisis |
| 6,187,615 B1 | 2/2001 | Kim et al. |
| 6,188,232 B1 | 2/2001 | Akram et al. |
| 6,191,487 B1 | 2/2001 | Rodenbeck et al. |
| 6,201,304 B1 | 3/2001 | Moden |
| 6,203,539 B1 | 3/2001 | Shimmick et al. |
| 6,212,767 B1 | 4/2001 | Tandy |
| 6,214,716 B1 | 4/2001 | Akram |
| 6,222,136 B1 | 4/2001 | Appelt et al. |
| 6,222,270 B1 | 4/2001 | Lee et al. |
| 6,225,689 B1 | 5/2001 | Moden et al. |
| 6,228,548 B1 | 5/2001 | King et al. |
| 6,228,687 B1 | 5/2001 | Akram et al. |
| 6,229,202 B1 | 5/2001 | Corisis |
| 6,232,666 B1 | 5/2001 | Corisis et al. |
| 6,235,552 B1 | 5/2001 | Kwon et al. |
| 6,235,554 B1 | 5/2001 | Akram et al. |
| 6,239,489 B1 | 5/2001 | Jiang |
| 6,246,108 B1 | 6/2001 | Corisis et al. |
| 6,247,629 B1 | 6/2001 | Jacobson et al. |
| 6,252,300 B1 | 6/2001 | Hsuan et al. |
| 6,258,623 B1 | 7/2001 | Moden et al. |
| 6,259,153 B1 | 7/2001 | Corisis |
| 6,261,865 B1 | 7/2001 | Akram |

| | | |
|---|---|---|
| 6,265,766 B1 | 7/2001 | Moden |
| 6,268,114 B1 | 7/2001 | Wen et al. |
| 6,271,580 B1 | 8/2001 | Corisis |
| 6,277,757 B1 | 8/2001 | Lin et al. |
| 6,281,042 B1 | 8/2001 | Ahn et al. |
| 6,281,577 B1 | 8/2001 | Oppermann et al. |
| 6,285,204 B1 | 9/2001 | Farnworth |
| 6,291,894 B1 | 9/2001 | Farnworth et al. |
| 6,294,837 B1 | 9/2001 | Akram et al. |
| 6,294,839 B1 | 9/2001 | Mess et al. |
| 6,297,547 B1 | 10/2001 | Akram |
| 6,303,981 B1 | 10/2001 | Moden |
| 6,310,390 B1 | 10/2001 | Moden |
| 6,324,253 B1 | 11/2001 | Yuyama et al. |
| 6,326,689 B1 | 12/2001 | Thomas |
| 6,326,697 B1 | 12/2001 | Farnworth |
| 6,326,698 B1 | 12/2001 | Akram |
| 6,329,222 B1 | 12/2001 | Corisis et al. |
| 6,329,632 B1 | 12/2001 | Fournier et al. |
| 6,331,221 B1 | 12/2001 | Cobbley |
| 6,341,009 B1 | 1/2002 | O'Connor et al. |
| 6,344,976 B1 | 2/2002 | Schoenfeld et al. |
| 6,359,254 B1 | 3/2002 | Brown |
| 6,359,328 B1 | 3/2002 | Dubin |
| 6,372,548 B2 | 4/2002 | Bessho et al. |
| 6,391,770 B2 | 5/2002 | Kosaki et al. |
| 6,406,636 B1 | 6/2002 | Vaganov |
| 6,429,528 B1 | 8/2002 | King et al. |
| 6,432,796 B1 | 8/2002 | Peterson |
| 6,433,303 B1 | 8/2002 | Liu et al. |
| 6,437,284 B1 | 8/2002 | Okamoto et al. |
| 6,437,441 B1 | 8/2002 | Yamamoto et al. |
| 6,437,586 B1 | 8/2002 | Robinson |
| 6,441,487 B2 | 8/2002 | Elenius et al. |
| 6,452,270 B1 | 9/2002 | Huang et al. |
| 6,457,515 B1 | 10/2002 | Vafai et al. |
| 6,459,039 B1 | 10/2002 | Bezama et al. |
| 6,468,889 B1 | 10/2002 | Iacoponi et al. |
| 6,483,044 B1 | 11/2002 | Ahmad |
| 6,486,083 B1 | 11/2002 | Mizuno et al. |
| 6,486,549 B1 | 11/2002 | Chiang et al. |
| 6,521,516 B2 | 2/2003 | Monzon et al. |
| 6,521,530 B2 | 2/2003 | Peters et al. |
| 6,534,192 B1 | 3/2003 | Abys et al. |
| 6,534,863 B2 | 3/2003 | Walker et al. |
| 6,545,563 B1 | 4/2003 | Smith |
| 6,548,376 B2 | 4/2003 | Jiang |
| 6,552,910 B1 | 4/2003 | Moon et al. |
| 6,555,782 B2 | 4/2003 | Isaji et al. |
| 6,560,047 B2 | 5/2003 | Choi et al. |
| 6,560,117 B2 | 5/2003 | Moon |
| 6,564,979 B2 | 5/2003 | Savaria |
| 6,569,711 B1 | 5/2003 | Susko et al. |
| 6,569,777 B1 | 5/2003 | Hsu et al. |
| 6,572,606 B2 | 6/2003 | Kliewer et al. |
| 6,576,531 B2 | 6/2003 | Peng et al. |
| 6,580,174 B2 | 6/2003 | McCormick et al. |
| 6,582,987 B2 | 6/2003 | Jun et al. |
| 6,593,644 B2 | 7/2003 | Chiu et al. |
| 6,599,436 B1 | 7/2003 | Matzke et al. |
| 6,606,251 B1 | 8/2003 | Kenny, Jr. et al. |
| 6,607,937 B1 | 8/2003 | Corisis |
| 6,614,033 B2 | 9/2003 | Suguro et al. |
| 6,614,092 B2 | 9/2003 | Eldridge et al. |
| 6,620,031 B2 | 9/2003 | Renteln |
| 6,620,731 B1 | 9/2003 | Farnworth |
| 6,621,045 B1 | 9/2003 | Liu et al. |
| 6,638,410 B2 | 10/2003 | Chen et al. |
| 6,653,236 B2 | 11/2003 | Wai et al. |
| 6,658,818 B2 | 12/2003 | Kurth et al. |
| 6,660,622 B2 | 12/2003 | Chen et al. |
| 6,660,630 B1 | 12/2003 | Chang et al. |
| 6,664,485 B2 | 12/2003 | Bhatt et al. |
| 6,667,551 B2 | 12/2003 | Hanaoka et al. |
| 6,680,459 B2 | 1/2004 | Kanaya et al. |
| 6,699,787 B2 | 3/2004 | Mashino et al. |
| 6,703,310 B2 * | 3/2004 | Mashino et al. ............ 438/666 |
| 6,708,405 B2 | 3/2004 | Hasler et al. |
| 6,746,971 B1 | 6/2004 | Ngo et al. |
| 6,756,564 B2 | 6/2004 | Tian |
| 6,770,958 B2 | 8/2004 | Wang et al. |
| 6,774,486 B2 | 8/2004 | Kinsman |
| 6,777,244 B2 | 8/2004 | Pepper et al. |
| 6,780,749 B2 | 8/2004 | Masumoto et al. |
| 6,790,775 B2 | 9/2004 | Fartash |
| 6,797,616 B2 | 9/2004 | Kinsman |
| 6,809,025 B2 | 10/2004 | Sandhu et al. |
| 6,809,421 B1 | 10/2004 | Hayasaka et al. |
| 6,818,464 B2 | 11/2004 | Heschel et al. |
| 6,825,127 B2 | 11/2004 | Ouellet et al. |
| 6,825,557 B2 | 11/2004 | DiBattista et al. |
| 6,828,175 B2 | 12/2004 | Wood et al. |
| 6,828,223 B2 | 12/2004 | Chuang |
| 6,838,377 B2 | 1/2005 | Tonami et al. |
| 6,852,621 B2 | 2/2005 | Hanaoka et al. |
| 6,856,023 B2 * | 2/2005 | Muta et al. ................. 257/774 |
| 6,858,891 B2 | 2/2005 | Farnworth et al. |
| 6,864,172 B2 | 3/2005 | Noma et al. |
| 6,864,457 B1 | 3/2005 | Alexander et al. |
| 6,867,390 B2 | 3/2005 | Clauer et al. |
| 6,873,054 B2 * | 3/2005 | Miyazawa et al. .......... 257/774 |
| 6,885,107 B2 | 4/2005 | Kinsman |
| 6,903,012 B2 | 6/2005 | Geefay et al. |
| 6,903,442 B2 | 6/2005 | Wood et al. |
| 6,910,268 B2 | 6/2005 | Miller |
| 6,913,952 B2 | 7/2005 | Moxham et al. |
| 6,916,725 B2 | 7/2005 | Yamaguchi et al. |
| 6,936,536 B2 | 8/2005 | Sinha |
| 6,943,056 B2 | 9/2005 | Nemoto et al. |
| 6,946,325 B2 | 9/2005 | Yean et al. |
| 6,951,627 B2 | 10/2005 | Li et al. |
| 6,953,748 B2 | 10/2005 | Yamaguchi et al. |
| 6,970,775 B2 | 11/2005 | Lederle et al. |
| 6,982,487 B2 | 1/2006 | Kim et al. |
| 7,022,609 B2 | 4/2006 | Yamamoto et al. |
| 7,023,090 B2 | 4/2006 | Huang et al. |
| 7,029,937 B2 | 4/2006 | Miyazawa et al. |
| 7,033,927 B2 | 4/2006 | Cohen et al. |
| 7,037,836 B2 | 5/2006 | Lee et al. |
| 7,041,598 B2 | 5/2006 | Sharma |
| 7,045,015 B2 | 5/2006 | Renn et al. |
| 7,083,425 B2 | 8/2006 | Chong et al. |
| 7,084,073 B2 | 8/2006 | Lee et al. |
| 7,091,124 B2 | 8/2006 | Rigg et al. |
| 7,092,284 B2 | 8/2006 | Braun et al. |
| 7,094,677 B2 | 8/2006 | Yamamoto et al. |
| 7,109,068 B2 | 9/2006 | Akram et al. |
| 7,151,009 B2 | 12/2006 | Kim et al. |
| 7,164,565 B2 | 1/2007 | Takeda |
| 7,166,247 B2 | 1/2007 | Kramer |
| 7,170,183 B2 | 1/2007 | Kim et al. |
| 7,183,176 B2 | 2/2007 | Sankarapillai et al. |
| 7,183,653 B2 | 2/2007 | Meyers et al. |
| 7,186,650 B1 | 3/2007 | Dakshina-Murthy |
| 7,190,061 B2 | 3/2007 | Lee et al. |
| 7,199,050 B2 | 4/2007 | Hiatt |
| 7,217,596 B2 | 5/2007 | Cobbley et al. |
| 7,217,888 B2 | 5/2007 | Sunohara et al. |
| 7,232,754 B2 | 6/2007 | Kirby et al. |
| 7,256,073 B2 | 8/2007 | Noma et al. |
| 7,262,134 B2 | 8/2007 | Kirby et al. |
| 7,262,495 B2 | 8/2007 | Chen et al. |
| 7,265,052 B2 | 9/2007 | Sinha |
| 7,271,482 B2 | 9/2007 | Kirby |
| 7,300,857 B2 | 11/2007 | Akram et al. |
| 7,317,256 B2 | 1/2008 | Williams et al. |

| | | | | | | |
|---|---|---|---|---|---|---|
| 2001/0020739 A1 | 9/2001 | Honda | | 2005/0275750 A1 | 12/2005 | Akram et al. |
| 2002/0005583 A1 | 1/2002 | Harada et al. | | 2005/0277293 A1 | 12/2005 | Kim et al. |
| 2002/0020898 A1 | 2/2002 | Vu et al. | | 2005/0282374 A1 | 12/2005 | Hwang et al. |
| 2002/0027293 A1 | 3/2002 | Hoshino | | 2005/0285154 A1 | 12/2005 | Akram et al. |
| 2002/0057468 A1 | 5/2002 | Segawa et al. | | 2006/0003566 A1 | 1/2006 | Emesh |
| 2002/0059722 A1 | 5/2002 | Murakami | | 2006/0011809 A1 | 1/2006 | Farnworth et al. |
| 2002/0060208 A1 | 5/2002 | Liu et al. | | 2006/0014313 A1 | 1/2006 | Hall et al. |
| 2002/0094607 A1 | 7/2002 | Gebauer et al. | | 2006/0023107 A1 | 2/2006 | Bolken et al. |
| 2002/0096729 A1 | 7/2002 | Tu et al. | | 2006/0024856 A1 | 2/2006 | Derderian et al. |
| 2002/0130390 A1 | 9/2002 | Ker et al. | | 2006/0035402 A1 | 2/2006 | Street et al. |
| 2002/0190371 A1 | 12/2002 | Mashino et al. | | 2006/0035415 A1 | 2/2006 | Wood et al. |
| 2003/0014895 A1 | 1/2003 | Lizotte | | 2006/0038183 A1 | 2/2006 | Oliver |
| 2003/0042564 A1 | 3/2003 | Taniguchi et al. | | 2006/0038272 A1 | 2/2006 | Edwards |
| 2003/0119308 A1 | 6/2003 | Geefay et al. | | 2006/0040421 A1 | 2/2006 | Farnworth et al. |
| 2003/0148597 A1 | 8/2003 | Tan et al. | | 2006/0040428 A1 | 2/2006 | Johnson |
| 2003/0216023 A1 | 11/2003 | Wark et al. | | 2006/0042952 A1 | 3/2006 | Oliver et al. |
| 2004/0004280 A1 | 1/2004 | Shibata | | 2006/0043262 A1 | 3/2006 | Akram |
| 2004/0018712 A1 | 1/2004 | Plas et al. | | 2006/0043509 A1 | 3/2006 | Watkins et al. |
| 2004/0023447 A1 | 2/2004 | Hirakata et al. | | 2006/0043512 A1 | 3/2006 | Oliver et al. |
| 2004/0041261 A1 | 3/2004 | Kinsman | | 2006/0043569 A1 | 3/2006 | Benson et al. |
| 2004/0043607 A1 | 3/2004 | Farnworth et al. | | 2006/0043599 A1 | 3/2006 | Akram et al. |
| 2004/0046251 A1 | 3/2004 | Lee | | 2006/0044433 A1 | 3/2006 | Akram |
| 2004/0073607 A1 | 4/2004 | Su et al. | | 2006/0046332 A1 | 3/2006 | Derderian et al. |
| 2004/0087441 A1 | 5/2004 | Bock et al. | | 2006/0046438 A1 | 3/2006 | Kirby |
| 2004/0094389 A1 | 5/2004 | Boyce | | 2006/0046468 A1 | 3/2006 | Akram et al. |
| 2004/0137661 A1 | 7/2004 | Murayama | | 2006/0046471 A1 | 3/2006 | Kirby |
| 2004/0137701 A1 | 7/2004 | Takao | | 2006/0046537 A1 | 3/2006 | Chong et al. |
| 2004/0141536 A1 | 7/2004 | Liu et al. | | 2006/0057776 A1 | 3/2006 | Tao |
| 2004/0159668 A1 | 8/2004 | Vasiadis | | 2006/0057836 A1 | 3/2006 | Nagarajan et al. |
| 2004/0159958 A1 | 8/2004 | Funaki | | 2006/0148250 A1 | 7/2006 | Kirby |
| 2004/0178491 A1 | 9/2004 | Akram et al. | | 2006/0151880 A1 | 7/2006 | Tang et al. |
| 2004/0180539 A1 | 9/2004 | Yamamoto et al. | | 2006/0154153 A1 | 7/2006 | Chiang et al. |
| 2004/0192033 A1 | 9/2004 | Hara | | 2006/0160367 A1 | 7/2006 | Wai et al. |
| 2004/0198033 A1 | 10/2004 | Lee et al. | | 2006/0177959 A1 | 8/2006 | Boettiger et al. |
| 2004/0198040 A1 | 10/2004 | Geefay et al. | | 2006/0177999 A1 | 8/2006 | Hembree et al. |
| 2004/0219342 A1 | 11/2004 | Boggs et al. | | 2006/0180941 A1 | 8/2006 | Kirby et al. |
| 2004/0219763 A1 | 11/2004 | Kim et al. | | 2006/0186097 A1 | 8/2006 | Watkins et al. |
| 2004/0222082 A1 | 11/2004 | Gopalraja et al. | | 2006/0186492 A1 | 8/2006 | Boettiger et al. |
| 2004/0245649 A1 | 12/2004 | Imaoka | | 2006/0191882 A1 | 8/2006 | Watkins et al. |
| 2004/0255258 A1 | 12/2004 | Li | | 2006/0199363 A1 | 9/2006 | Kirby et al. |
| 2004/0262753 A1 | 12/2004 | Kashiwazaki | | 2006/0204651 A1 | 9/2006 | Wai et al. |
| 2005/0026443 A1 | 2/2005 | Goo et al. | | 2006/0208360 A1 | 9/2006 | Yiu et al. |
| 2005/0037608 A1 | 2/2005 | Andricacos et al. | | 2006/0223301 A1 | 10/2006 | Vanhaelemeersch et al. |
| 2005/0046002 A1 | 3/2005 | Lee et al. | | 2006/0240687 A1 | 10/2006 | Chong et al. |
| 2005/0064707 A1 | 3/2005 | Sinha | | 2006/0249849 A1 | 11/2006 | Cohen |
| 2005/0067620 A1 | 3/2005 | Chan et al. | | 2006/0252254 A1 | 11/2006 | Basol |
| 2005/0069782 A1 | 3/2005 | Elenius et al. | | 2006/0252262 A1 | 11/2006 | Kazemi |
| 2005/0101116 A1 | 5/2005 | Tseng | | 2006/0255443 A1 | 11/2006 | Hwang et al. |
| 2005/0104228 A1 | 5/2005 | Rigg et al. | | 2006/0264041 A1 | 11/2006 | Rigg et al. |
| 2005/0106834 A1 | 5/2005 | Andry et al. | | 2006/0270108 A1 | 11/2006 | Farnworth et al. |
| 2005/0110095 A1 | 5/2005 | Shih et al. | | 2006/0278979 A1 | 12/2006 | Rangel |
| 2005/0110889 A1 | 5/2005 | Tuttle et al. | | 2006/0278980 A1 | 12/2006 | Trezza et al. |
| 2005/0127478 A1 | 6/2005 | Hiatt et al. | | 2006/0278988 A1 | 12/2006 | Trezza et al. |
| 2005/0136646 A1 | 6/2005 | Larnerd et al. | | 2006/0281224 A1 | 12/2006 | Edelstein et al. |
| 2005/0139390 A1 | 6/2005 | Kim et al. | | 2006/0281243 A1 | 12/2006 | Trezza |
| 2005/0150683 A1 | 7/2005 | Farnworth et al. | | 2006/0289967 A1 | 12/2006 | Heck et al. |
| 2005/0151228 A1 | 7/2005 | Tanida et al. | | 2006/0289968 A1 | 12/2006 | Sulfridge |
| 2005/0164500 A1 | 7/2005 | Lindgren | | 2006/0290001 A1 | 12/2006 | Sulfridge |
| 2005/0184219 A1 | 8/2005 | Kirby | | 2006/0292877 A1 | 12/2006 | Lake |
| 2005/0191861 A1 | 9/2005 | Verhaverbeke | | 2007/0004079 A1 | 1/2007 | Geefay et al. |
| 2005/0194169 A1 | 9/2005 | Tonomura | | 2007/0012655 A1 | 1/2007 | Kwon et al. |
| 2005/0208766 A1 | 9/2005 | Kirby et al. | | 2007/0020805 A1 | 1/2007 | Kim et al. |
| 2005/0227382 A1 | 10/2005 | Hui | | 2007/0020935 A1 | 1/2007 | Taylor et al. |
| 2005/0231626 A1 | 10/2005 | Tuttle et al. | | 2007/0023121 A1 | 2/2007 | Jones et al. |
| 2005/0236708 A1 | 10/2005 | Farnworth et al. | | 2007/0032061 A1 | 2/2007 | Farnworth et al. |
| 2005/0247894 A1 | 11/2005 | Watkins et al. | | 2007/0035033 A1 | 2/2007 | Ozguz et al. |
| 2005/0253213 A1 | 11/2005 | Jiang et al. | | 2007/0037379 A1 | 2/2007 | Enquist et al. |
| 2005/0254133 A1 | 11/2005 | Akram et al. | | 2007/0042598 A1 | 2/2007 | Park |
| 2005/0258530 A1 | 11/2005 | Vindasius et al. | | 2007/0045120 A1 | 3/2007 | Tiwari et al. |
| 2005/0272221 A1 | 12/2005 | Yen et al. | | 2007/0045388 A1 | 3/2007 | Farnworth et al. |
| 2005/0275048 A1 | 12/2005 | Farnworth et al. | | 2007/0045515 A1 | 3/2007 | Farnworth et al. |
| 2005/0275049 A1 | 12/2005 | Kirby et al. | | 2007/0045632 A1 | 3/2007 | Oliver et al. |
| 2005/0275051 A1 | 12/2005 | Farnworth et al. | | 2007/0045779 A1 | 3/2007 | Hiatt |

| Publication No. | Date | Inventor |
|---|---|---|
| 2007/0045806 A1 | 3/2007 | Hsuan |
| 2007/0045812 A1 | 3/2007 | Heng |
| 2007/0045826 A1 | 3/2007 | Lee et al. |
| 2007/0045834 A1 | 3/2007 | Chong et al. |
| 2007/0048896 A1 | 3/2007 | Andry et al. |
| 2007/0048994 A1 | 3/2007 | Tuttle |
| 2007/0049016 A1 | 3/2007 | Hiatt et al. |
| 2007/0049019 A1 | 3/2007 | Wai et al. |
| 2007/0057028 A1 | 3/2007 | Lake et al. |
| 2007/0077753 A1 | 4/2007 | Iwatake et al. |
| 2007/0082427 A1 | 4/2007 | Shirahama et al. |
| 2007/0096263 A1 | 5/2007 | Furukawa et al. |
| 2007/0099395 A1 | 5/2007 | Sridhar et al. |
| 2007/0111386 A1 | 5/2007 | Kim et al. |
| 2007/0138562 A1 | 6/2007 | Trezza |
| 2007/0145563 A1 | 6/2007 | Punzalan et al. |
| 2007/0152342 A1 | 7/2007 | Tsao et al. |
| 2007/0155997 A1 | 7/2007 | Li et al. |
| 2007/0158839 A1 | 7/2007 | Trezza |
| 2007/0158853 A1 | 7/2007 | Sinha |
| 2007/0161235 A1 | 7/2007 | Trezza |
| 2007/0166991 A1 | 7/2007 | Sinha |
| 2007/0166997 A1 | 7/2007 | Knorr |
| 2007/0167004 A1 | 7/2007 | Trezza |
| 2007/0170574 A1 | 7/2007 | Lauxtermann et al. |
| 2007/0178694 A1 | 8/2007 | Hiatt |
| 2007/0182020 A1 | 8/2007 | Trezza et al. |
| 2007/0190803 A1 | 8/2007 | Singh et al. |
| 2007/0197013 A1 | 8/2007 | Trezza |
| 2007/0202617 A1 | 8/2007 | Hembree |
| 2007/0222050 A1 | 9/2007 | Lee et al. |
| 2007/0222054 A1 | 9/2007 | Hembree |
| 2007/0228576 A1 | 10/2007 | Trezza |
| 2007/0228926 A1 | 10/2007 | Teo et al. |
| 2007/0262424 A1 | 11/2007 | Hiatt |
| 2007/0267138 A1 | 11/2007 | White et al. |
| 2007/0281473 A1 | 12/2007 | Clark et al. |
| 2007/0293040 A1 | 12/2007 | Emesh et al. |
| 2008/0006850 A1 | 1/2008 | Ribnicek et al. |
| 2008/0050904 A1 | 2/2008 | Lake |
| 2008/0050911 A1 | 2/2008 | Borthakur |
| 2008/0054444 A1 | 3/2008 | Tuttle |
| 2008/0057620 A1 | 3/2008 | Pratt |
| 2008/0079120 A1 | 4/2008 | Foster et al. |
| 2008/0079121 A1 | 4/2008 | Han |
| 2008/0081386 A1 | 4/2008 | Raravikar et al. |
| 2008/0081398 A1 | 4/2008 | Lee et al. |
| 2008/0265933 A1 | 10/2008 | Tanioka et al. |

FOREIGN PATENT DOCUMENTS

| | | |
|---|---|---|
| EP | 1415950 A2 | 5/2004 |
| JP | 63052432 | 3/1988 |
| JP | 02235589 | 9/1990 |
| JP | 2001077496 | 3/2001 |
| JP | 2001298147 | 10/2001 |
| JP | 2002018585 A | 1/2002 |
| JP | 2005093980 | 4/2005 |
| JP | 2005310817 | 11/2005 |
| KR | 20010018694 | 3/2001 |
| KR | 20020022122 | 3/2002 |
| KR | 20020061812 | 7/2002 |
| TW | 250597 B | 3/2006 |
| WO | 2004109770 A2 | 12/2004 |
| WO | WO-2005022965 | 3/2005 |
| WO | WO-2005036940 | 4/2005 |
| WO | WO-2006053036 | 5/2006 |
| WO | WO-2006124597 | 11/2006 |
| WO | WO-2007025812 | 3/2007 |
| WO | WO-2007043718 | 4/2007 |

OTHER PUBLICATIONS

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

U.S. Appl. No. 11/863,579, Lee.

U.S. Appl. No. 11/774,419, Hutto.

U.S. Appl. No. 11/951,751, Sulfridge.

U.S. Appl. No. 11/848,836, Jeung et al.

U.S. Appl. No. 11/966,824, Pratt.

U.S. Appl. No. 11/217,712, Puah.

Aachboun, S. and P. Ranson, "Cryogenic etching of deep narrow trenches in silicon," J. Vac. Sci. Technol. A 18(4), Jul./Aug. 2000, pp. 1848-1852.

Aachboun, S. and P. Ranson, "Deep anisotropic etching of silicon," J. Vac. Sci. Technol. A 17(4), Jul./Aug. 1999, pp. 2270-2273.

Arunasalam, P. et al., "Thermo-Mechanical Analysis of Thru-Silicon-Via Based High Density Compliant Interconnect," Electronic Components and Technology Conference, 2007, ECTC '07, Proceedings, 57th, May 29, 2007-Jun. 1, 2007, pp. 1179-1185.

Bernstein, K. et al., "Interconnects in the Third Dimension: Design Challenges for 3D ICs," Design Automation Conference, 2007, DAC '07, 44th ACM/IEEE, Jun. 4-8, 2007, pp. 562-567.

Cheung, T.S.D. et al., "On-Chip Interconnect for mm-Wave Applications Using an All-Copper Technology and Wavelength Reduction," 2003 IEEE International Solid-State Circuits Conference.

Chou, Bill et al., "Ultra Via Substrate for Advanced BGA Applications," Pan Pacific Symposium, Jan. 25, 2000, <http://www.smta.org/files/PanPac00-ChouBill.pdf>.

Hirafune, S. et al., "Packaging Technology for Imager Using Through-hole Interconnection in Si Substrate," Proceeding of HDP'04, IEEE, pp. 303-306, Jul. 2004.

Kyocera Corporation, Memory Package, 1 page, retrieved from the Internet on Dec. 3, 2004, <http://global.kyocera.com/prdct/semicon/ic_pkg/memory_p.html>.

Lee, Rex A. et al., "Laser Created Silicon Vias for Stacking Dies in MCMs," IEEE/CHMT IEMT Symposium, 1991, pp. 262-265.

Lee, T.K. et al., "A Novel Joint-in-Via Flip-Chip Chip-Scale Package," IEEE Transactions on Advanced Packaging, vol. 29, No. 1, pp. 186-194, Feb. 2006.

Rasmussen, F.E., et al., "Fabrication of High Aspect Ratio Through-Wafer Vias in CMOS Wafers for 3-D Packaging Applications," The 12th International Conference on Solid State Sensors, Actuators and Microsystems, Boston, Jun. 8-12, 2003.

Savastiouk, S. et al., "Thru-silicon interconnect technology," 26th IEEE/CPMT International Electronics Manufacturing Technology Symposium, 2000, abstract.

Schaper, L. et al., "Integrated System Development for 3-D VLSI," Electronic Components and Technology Conference, 2007, ECTC '07, Proceedings, 57th, May 29, 2007-Jun. 1, 2007, pp. 853-857.

Takahashi, K. et al., "Through Silicon Via and 3-D Wafer/Chip Stacking Technology," 2006 Symposium on VLSI Circuits Digest of Technical Papers.

Takizawa, T. et al., "Conductive Interconnections Through Thick Silicon Substrates for 3D Packaging," The Fifteenth International Conference on Micro Electro Mechanical Systems, Las Vegas, Jan. 20-24, 2002.

Tezcan, D.S. et al., "Sloped Through Wafer Vias for 3D Wafer Level Packaging," Electronic Components and Technology Conference, 2007, ECTC '07, Proceedings, 57th, May 29, 2007-Jun. 1, 2007, pp. 643-647.

Trigas, C., "System-In-Package or System-On-Chip?," EE Times, Sep. 19, 2003, <http://www.eetimes.com/story/OEG20030919S0049>.

XSiL, xise200 for vias and micro-machining, <http://www.xsil.com/products/index/html>, retrieved from the Internet on Aug. 16, 2003.

Yamamoto, S. et al., "Si Through-Hole Interconnections Filled with Au-Sn Solder by Molten Metal Suction Method," pp. 642-645, IEEE, MEMS-03 Kyoto, The Sixteenth Annual International Conference on Micro Electro Mechanical Systems, Jan. 2003, ISBN 0-7803-7744-3.

Amazawa, T. et al., "Planarized Multilevel Interconnection Using Chemical Mechanical Polishing of Selective CVD-Al Via Plugs," IEEE Transactions on Electron Devices, vol. 45, No. 4, pp. 815-820, Apr. 1998.

Armacost, M. et al., "Plasma-Etching Processes for ULSI Semiconductor Circuits," IBM J. Res. Develop., vol. 43, No. 1/2, pp. 39-72, Jan./Mar. 1999, <http://www.research.ibm.com/journal/rd/431/armacost.pdf>.

Blackburn, J.M. et al., "Deposition of Conformal Copper and Nickel Films from Supercritical Carbon Dioxide," Science, vol. 94, Oct. 2001, pp. 141-145.

De Boer, M.J. et al., "Micromachining of Buried Micro Channels in Silicon," Journal of Microelectromechanical Systems, vol. 9, No. 1, Mar. 2000, IEEE, ISSN: 1057-7157.

Gutmann, R.J., "Wafer-Level Three-Dimensional Monolithic Integration for Heterogeneous Silicon ICs," 2004 Topical Meeting on Silicon Monolithic Integrated Circuits in RF Systems, IEEE, Sep. 8-10, 2004, pp. 45-48.

Jang, D.M. et al., "Development and Evaluation of 3-D SiP with Vertically Interconnected Through Silicon Vias (TSV)," Proceedings of the 57th Electronic Components and Technology Conference, IEEE, May 29, 2007-Jun. 1, 2007, pp. 847-852, ISBN: 1-4244-0985-3.

Kada, M. et al., "Advancements in Stacked Chip Scale Packaging (S-CSP) Provides System-in-a-Package Functionality for Wireless and Handheld Applications," Future Fab Intl., vol. 9, Jan. 7, 2000.

Keigler, A. et al., "Enabling 3-D Design," Semiconductor International, Aug. 2007.

Kim, J.Y. et al., "S-RCAT (Sphere-shaped-Recess-Channel-Array Transistor) Technology for 70nm DRAM Feature Size and Beyond," 2005 Symposium on VLSI Technology, Digest of Technical Papers, Jun. 14-16, 2005, pp. 34-35, IEEE, ISBN: 4-900784-02-8.

Kuhn, Markus and Jose A. Rodriguez, "Adsorption of sulfur on bimetallic surfaces: Formation of copper sulfides on Pt(111) and Ru(001)," J. Vac. Sci. Technol. A 13(3), pp. 1569-1573, May/Jun. 1995.

Lee, H.M. et al., Abstract of "Abatement of Sulfur Hexaflouride Emissions from the Semiconductor Manufacturing Process by Atmospheric-Pressure Plasmas," 1 page, Aug. 2004, <http:www.awma.org/journal/ShowAbstract.asp?Year=&PaperID=1256>.

Morrow, P.R. et al., "Three-Dimensional Wafer Stacking Via Cu-Cu Bonding Integrated With 65-nm Strained-Si/Low-k CMOS Technology," IEEE Electron Device Letters, vol. 27, No. 5, pp. 335-337, May 2006, ISBN: 0741-3106.

Pienimaa, S.K. et al., "Stacked Thin Dice Package," Proceedings of the 51st Electronic Components and Technology Conference, 2001, pp. 361-366, IEEE.

Solberg, V., "Innovative 3-D Solutions for Multiple Die Packaging," SMTA International Conference, Sep. 21, 2003.

Takahashi, K. et al., "Current Status of Research and Development for Three-Dimensional Chip Stack Technology," Jpn. J. Appl. Phys., vol. 40 (2001), pp. 3032-3037, Part 1, No. 4B, Apr. 30, 2001, abstract.

Thomas, D.J. et al., "Etching of Vias and Trenches Through Low k Dielectrics with Feature Sizes Down to 0.1 mm Using M0RIO High Density Plasmas," presented at the 197th Meeting of the Electrochemical Society, Toronto 2000, <http://www.trikon.com/pdfs/ECS2b.pdf>.

* cited by examiner

MICROELECTRONICS DEVICES, HAVING VIAS, AND PACKAGED MICROELECTRONIC DEVICES HAVING VIAS

APPLICATION(S) INCORPORATED BY REFERENCE

This application is a divisional of U.S. patent application Ser. No. 10/713,878, filed Nov. 13, 2003, now U.S. Pat. No. 7,091,124, and incorporated herein in its entirety by reference. This application is related to U.S. patent application Ser. No. 10/733,226, entitled MICROELECTRONIC DEVICES AND METHODS FOR FILLING VIAS IN MICROELECTRONIC DEVICES, filed Dec. 10, 2003.

TECHNICAL FIELD

The following disclosure relates generally to microelectronic devices and methods for packaging microelectronic devices and, more particularly, to methods for forming vias in microelectronic workpieces.

BACKGROUND

Conventional die-level packaged microelectronic devices can include a microelectronic die, an interposer substrate or lead frame attached to the die, and a moulded casing around the die. The die generally includes an integrated circuit and a plurality of bond-pads coupled to the integrated circuit. The bond-pads are typically coupled to terminals on the interposer substrate or lead frame and serve as external electrical contacts on the die through which supply voltage, signals, etc., are transmitted to and from the integrated circuit. In addition to the terminals, the interposer substrate can also include ball-pads coupled to the terminals by conductive traces supported in a dielectric material. Solder balls can be attached to the ball-pads in one-to-one correspondence to define a "ball-grid array." Packaged microelectronic devices with ball-grid arrays are generally higher grade packages having lower profiles and higher pin counts than conventional packages using lead frames.

One process for packaging a die with a ball-grid array at the die level includes (a) forming a plurality of dies on a semiconductor wafer, (b) cutting the wafer to separate or singulate the dies, (c) attaching individual dies to an interposer substrate, (d) wire-bonding the bond-pads of the dies to the terminals of the interposer substrate, and (e) encapsulating the dies with a suitable moulding compound. Mounting individual dies to interposer substrates or lead frames in the foregoing manner can be a time-consuming and expensive process. In addition, forming robust wire-bonds that can withstand the forces involved in moulding processes becomes more difficult as the demand for higher pin counts and smaller packages increases. Moreover, the process of attaching individual dies to interposer substrates or lead frames may damage the bare dies. These difficulties have made the packaging process a significant factor in the production of microelectronic devices.

Another process for packaging microelectronic devices is wafer-level packaging. In this process, a plurality of microelectronic dies are formed on a wafer, and then a redistribution layer is formed over the dies. The redistribution layer can include a dielectric layer and a plurality of exposed ball-pads forming arrays on the dielectric layer. Each ball-pad array is typically arranged over a corresponding die, and the ball-pads in each array are coupled to corresponding bond-pads of the die by conductive traces extending through the dielectric layer. After forming the redistribution layer on the wafer, discrete masses of solder paste are deposited onto the individual ball-pads. The solder paste is then reflowed to form small solder balls or "solder bumps" on the ball-pads. After forming the solder balls, the wafer is singulated to separate the individual microelectronic devices from each other.

Wafer-level packaging is a promising development for increasing efficiency and reducing the cost of microelectronic devices. By "pre-packaging" individual dies with a redistribution layer before cutting the wafers to singulate the dies, sophisticated semiconductor processing techniques can be used to form smaller arrays of solder balls. Additionally, wafer-level packaging is an efficient process that simultaneously packages a plurality of dies, thereby reducing costs and increasing throughput.

Packaged microelectronic devices such as those described above are used in cellphones, pagers, personal digital assistants, computers, and many other electronic products. To meet the demand for smaller electronic products, there is a continuing drive to increase the performance of packaged microelectronic devices, while at the same time reducing the height and the surface area or "footprint" of such devices on printed circuit boards. Reducing the size of microelectronic devices, however, becomes more difficult as the performance increases because higher performance typically means more integrated circuitry and bond-pads. This results in larger ball-grid arrays and thus larger footprints. One technique for increasing the component density of microelectronic devices within a given footprint is to stack one device on top of another.

FIG. 1 schematically illustrates a first microelectronic device 10 attached to a second microelectronic device 20 in a wire-bonded, stacked-die arrangement. The first microelectronic device 10 includes a die 12 having an integrated circuit 14 electrically coupled to a series of bond-pads 16. A redistribution layer 18 electrically couples a plurality of first solder balls 11 to corresponding bond-pads 16. The second microelectronic device 20 similarly includes a die 22 having an integrated circuit 24 electrically coupled to a series of bond-pads 26. A redistribution layer 28 electrically couples a plurality of second solder balls 21 to corresponding bond-pads 26. Wire-bonds 13 extending from the first solder balls 11 to the second solder balls 21 electrically couple the first microelectronic device 10 to the second microelectronic device 20.

The second solder balls 21 on the second microelectronic device 20 are positioned outboard of the first microelectronic device 10 to facilitate installation of the wire-bonds 13. As mentioned above, such installation can be a complex and/or expensive process. Forming the wire-bonds 13, for example, is not only difficult because it requires individual wires between each pair of solder balls, but it may not be feasible to form wire-bonds for the high-density, fine-pitch arrays of some high performance devices. In addition, positioning the second solder balls 21 outboard of the first microelectronic device 10 to accommodate the wire-bonds 13 undesirably increases the footprint of the stacked-die arrangement.

DETAILED DESCRIPTION

A. Overview

Figure 1:
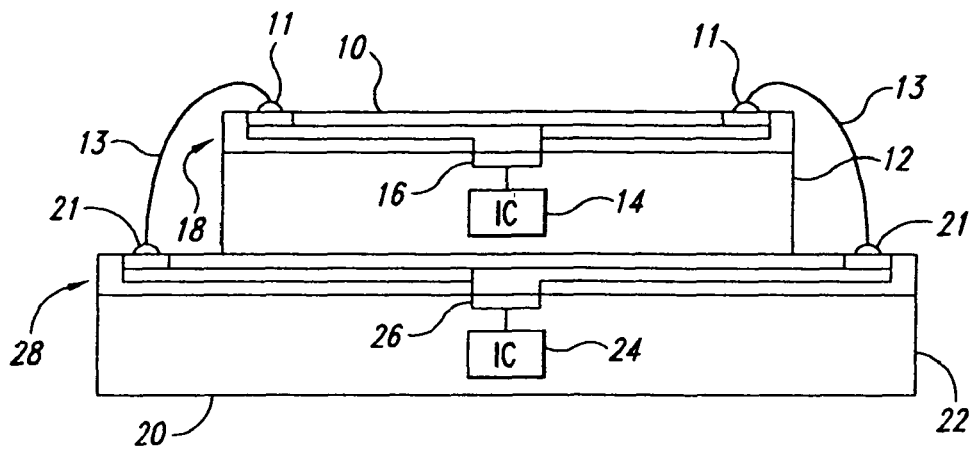
FIG. 1 schematically illustrates a first microelectronic device attached to a second microelectronic device in a stacked-die arrangement in accordance with the prior art.

The following disclosure describes several embodiments of microelectronic devices, methods for packaging microelectronic devices, and methods for forming vias in dies and other substrates. One aspect of the invention is directed toward a method of manufacturing a microelectronic device having a die with an integrated circuit. In one embodiment, the method includes forming a bond-pad on the die electrically coupled to the integrated circuit, and forming a redistribution layer on the die. The redistribution layer can include a conductive line having a first end portion attached to the bond-pad and a second end portion spaced apart from the bond-pad. The method can further include forming a via or passage through the die, the bond-pad, and the first end portion of the conductive line. An electrically conductive material can then be deposited into at least a portion of the passage to provide a conductive interconnect extending through the die that is electrically coupled to the bond-pad and the conductive line.

In one aspect of this embodiment, the method can further include cleaning the passage and applying a passivation layer to at least a portion of the passage before depositing the electrically conductive material into the passage. In one embodiment, the passivation layer can at least generally insulate the die from the electrically conductive material filling the passage. In another aspect of this embodiment, the method can further include applying a TiCL$_4$ TiN layer to at least a portion of the passage, and applying a Ni layer over at least a portion of the TiCL$_4$ TiN layer before depositing the electrically conductive material into the passage.

Another aspect of the invention is directed toward a set of microelectronic devices. In one embodiment, the microelectronic device set includes a first microelectronic device stacked on a second microelectronic device in a stacked-die arrangement. The first microelectronic device can include a first die with a first integrated circuit, a first bond-pad electrically coupled to the first integrated circuit, and a passage through the first die and the first bond-pad. The first die also includes a metal interconnect in the passage and coupled to the first bond-pad to form a conductive link extending at least partially through the first microelectronic device. The second microelectronic device can include a second die with a second integrated circuit and a second bond-pad electrically coupled to the second integrated circuit. The second bond-pad can be electrically coupled to the conductive link of the first microelectronic device.

Many specific details of the present invention are described below with reference to semiconductor devices. The term "microfeature workpiece," however, as used throughout this disclosure includes substrates upon which and/or in which microelectronic devices, micromechanical devices, data storage elements, read/write components, and other features are fabricated. For example, such microelectronic workpieces can include semiconductor wafers (e.g., silicon or gallium arsenide wafers), glass substrates, insulated substrates, and many other types of substrates. The feature signs in microfeature workpieces can include very small features of 0.11 μm or less, but larger features are also included on microfeature workpieces.

Specific details of several embodiments of the invention are described below with reference to microelectronic dies and other microelectronic devices in order to provide a thorough understanding of such embodiments. Other details describing well-known structures often associated with microelectronic devices are not set forth in the following description to avoid unnecessarily obscuring the description of the various embodiments. Persons of ordinary skill in the art will understand, however, that the invention may have other embodiments with additional elements or without several of the elements shown and described below with reference to FIGS. 2-7.

In the Figures, identical reference numbers identify identical or at least generally similar elements. To facilitate the discussion of any particular element, the most significant digit or digits of any reference number refer to the Figure in which that element is first introduced. For example, element 210 is first introduced and discussed with reference to FIG. 2.

B. Embodiments of Microfeature Workpieces

Figure 2:
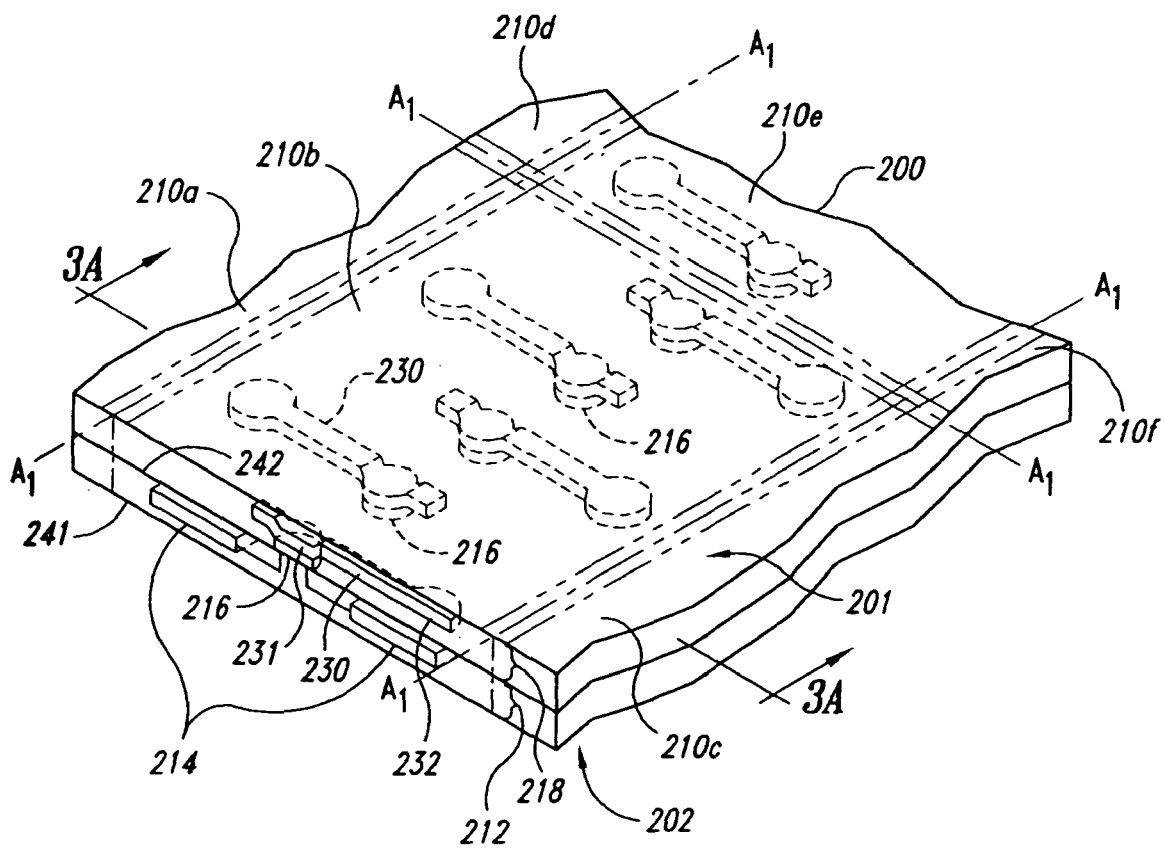
FIG. 2 is a cut-away isometric view of a microfeature workpiece configured in accordance with an embodiment of the invention.

FIG. 2 is a cut-away isometric view of a wafer or microfeature workpiece 200 in accordance with an embodiment of the invention. In one aspect of this embodiment, the microfeature workpiece 200 includes a front side 201, a back side 202, and a plurality of microelectronic devices 210 (identified individually as microelectronic devices 210a-f). Each microelectronic device 210 can include a microelectronic die 212 and a redistribution layer 218 (RDL 218) formed on the die 212. Each die 212 can include an integrated circuit 214 (shown schematically), a first surface 241, a second surface 242, and a plurality of metallic and/or conductive bond-pads 216 electrically coupled to the integrated circuit 214. The RDL 218 can include a plurality of metallic and/or conductive lines 230 that each have a first end portion 231 electrically coupled to a corresponding bond-pad 216, a second end portion 232 spaced outwardly from the first end portion 231, and a trace between the first and second end portions 231 and 232. As described in greater detail below, the second end portions 232 in one embodiment can have ball-pads configured to receive solder balls for electrically connecting the microelectronic devices 210 to other devices.

In the embodiment illustrated in FIG. 2, the processing of the microelectronic devices 210 has not been completed. As described below with reference to FIGS. 3A-6, additional processing can be carried out on the microfeature workpiece 200 to configure or package the individual microelectronic devices 210 for use in an electronic device or product. After this additional processing is complete, the microfeature workpiece 200 is cut along lines $A_1$-$A_1$ to singulate the microelectronic devices 210.

Figure 3A:
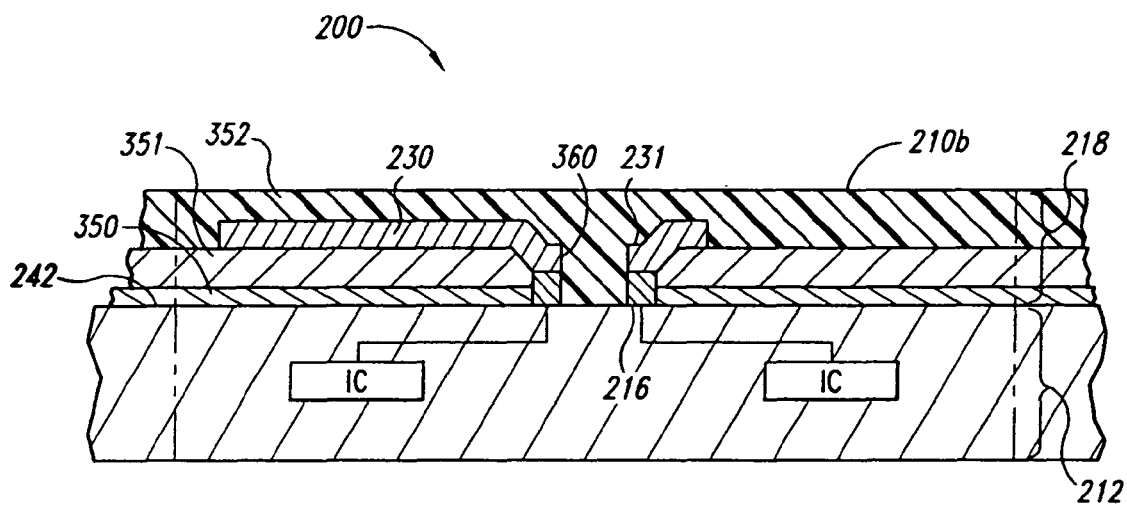
FIGS. 3A-3G are schematic cross-sectional views illustrating various stages in a method of forming a conductive interconnect in a microelectronic device in accordance with an embodiment of the invention.

FIGS. 3A-3G illustrate various stages in a method of forming a conductive interconnect in the microelectronic device 210b in accordance with an embodiment of the invention. FIG. 3A, more specifically, is a schematic side cross-sectional view of the microfeature workpiece 200 taken substantially along line 3A-3A in FIG. 2. In one aspect of this embodiment, the RDL 218 includes a first passivation layer 350 applied to the second surface 242 of the die 212, and a first dielectric layer 351 applied over the first passivation layer 350. The first dielectric layer 351 can be removed around the bond-pad 216 by etching or another known process to expose the bond-pad 216. Exposing the bond-pad 216 in this manner allows the fist end portion 231 of the conductive line 230 to contact the bond-pad 216 when the conductive line 230 is formed over the first dielectric layer 351.

After forming the conductive line 230, a first hole 360 is formed through the first end portion 231 of the conductive line 230 and the bond-pad 216. In one embodiment, the first hole 360 can be formed by an etching process. In other embodiments, the first hole 360 can be formed using other suitable methods. Additionally, a second dielectric layer 352 is applied over the microfeature workpiece 200 to cover the conductive line 230 and fill the first hole 360.

In one embodiment, the first and second dielectric layers 351, 352 include a polyimide material. In other embodiments, the first and second dielectric layers 351, 352 include other nonconductive and/or insulative materials. The first passivation layer 350 and/or one or more subsequent passivation layers can include a low temperature chemical vapor deposition (low temperature CVD) material, such as tetraethylorthosilicate (TEOS). In other embodiments, one or more of the passivation layers on the microfeature workpiece 200 can include parylene and/or other suitable materials, such as silicon oxide ($SiO_x$) or silicon nitride ($Si_3N_4$). The foregoing list of passivation and dielectric material options is not exhaustive. Accordingly, in other embodiments, it is expected that other suitable materials and processes can be used to form one or more of the layers discussed herein. In addition, it is further expected that, in yet other embodiments, one or more of the layers described above with reference to FIG. 3A, or described below with reference to subsequent Figures, may be omitted.

FIG. 3A illustrates one method for providing an RDL on a die in accordance with the present invention. In other embodiments, other methods resulting in other RDL/die configurations can be used. Accordingly, as those of ordinary skill in the art will recognize, the methods described in detail below for forming vias in microelectronic devices are not limited to the particular RDL/die configuration illustrated in FIG. 3A.

Figure 3B:
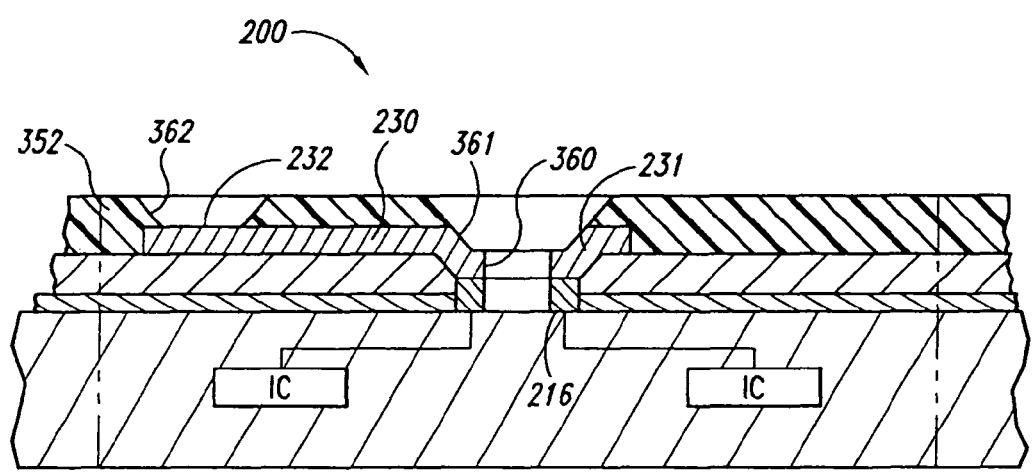

FIGS. 3B-3G are schematic side cross-sectional views similar to FIG. 3A showing the microfeature workpiece 200 in subsequent stages of forming the interconnect. FIG. 3B, for example, is a schematic side cross-sectional view of the microfeature workpiece 200 after a second hole 361 and a third hole 362 have been formed through the second dielectric layer 352. In one aspect of this embodiment, forming the second hole 361 includes removing the second dielectric layer 352 from the first hole 360, thereby exposing the bond-pad 216 and the first end portion 231 of the conductive line 230. The third hole 362 is formed through the second dielectric layer 352 to expose part of the second end portion 232 of the conductive line 230. In one aspect of this embodiment, the second and third holes 361, 362 can be formed by dry-etching or by other suitable methods known to those of skill in the semiconductor processing art.

Figure 3C:
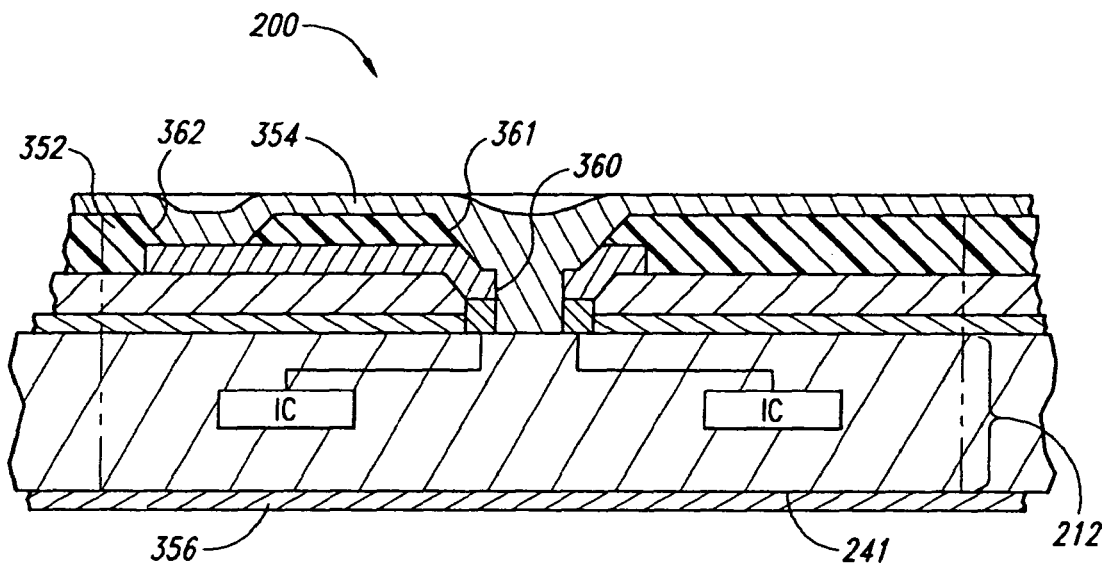

FIG. 3C illustrates the microfeature workpiece 200 of FIG. 3B after application of a second passivation layer 354 and a third passivation layer 356. The second passivation layer 354 is applied over the second dielectric layer 352 such that it is deposited into the first hole 360, the second hole 361, and the third hole 362. The third passivation layer 356 is applied to the first surface 241 of the die 212. In one aspect of this embodiment, the second and third passivation layers 354, 356 can include parylene. In other embodiments, the second passivation layer 354 can include other materials, such as an oxide.

Figure 3D:
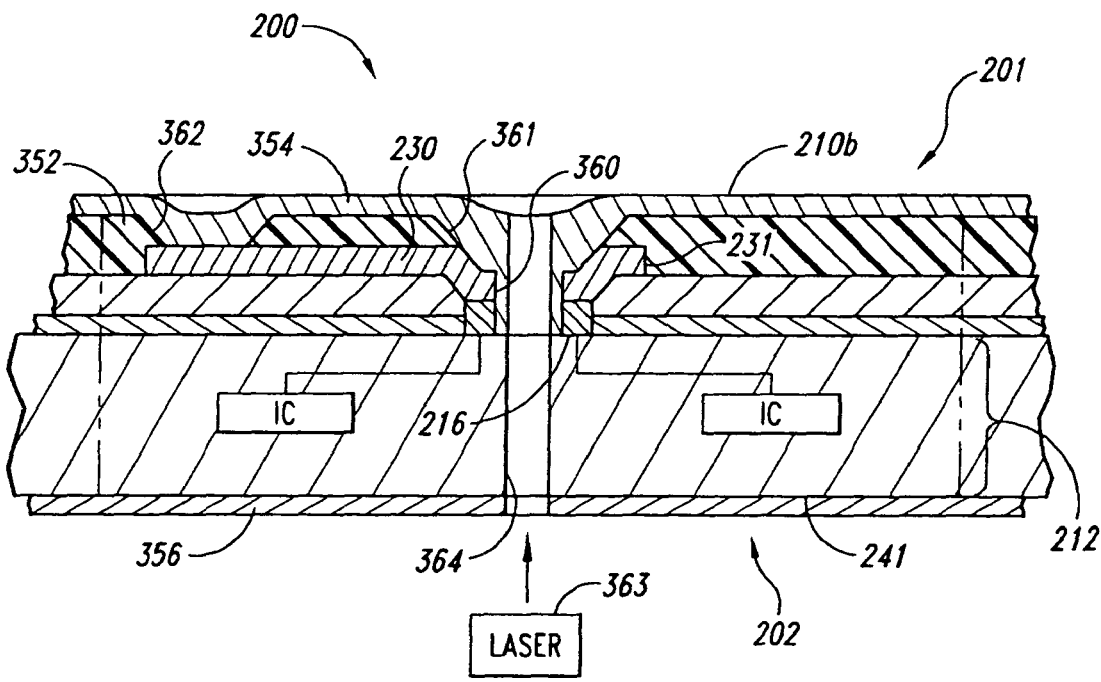

Referring next to FIG. 3D, after application of the second and third passivation layers 354, 356, a laser 363 (shown schematically) cuts a passage or through-hole 364 through the microelectronic device 210b. In one aspect of this embodiment, the through-hole 364 extends at least through the die 212, the bond-pad 216, and the first end portion 231 of the conductive line 230. For example, in the illustrated embodiment, the through-hole 364 extends entirely through the third passivation layer 356, the die 212, and the second passivation layer 354. The laser 363 generally cuts from the back side 202 of the microfeature workpiece 200 toward the front side 201, but it can conceivably cut from the front side 201 toward the back side 202. Further, the laser 363 can be aligned with respect to the bond-pad 216 using a pattern recognition system or other known alignment system. In other embodiments, the through-hole 364 can be formed using other suitable methods known to those of skill in the art. For example, in another embodiment, it is expected that the through-hole 364 can be formed by a suitable etching or drilling process.

After forming the through-hole 364, it is cleaned to remove ablation (i.e., slag) and/or other undesirable byproducts resulting from the laser cut. In one embodiment, the through-hole 364 is cleaned using a wet-etch process. In this embodiment, the portion of the second passivation layer 354 remaining in the first hole 360 protects the bond-pad 216 and the first end portion 231 of the conductive line 230 from the wet-etch chemistry used to clean the slag from the die area of through-hole 364. This feature allows a single cleaning process/chemistry to clean the slag from the via for the interconnect without having to use a second cleaning process to clean residue on the bond-pad 216 and first end portion 231. In other embodiments, the through-hole 364 can be cleaned using other methods. For example, in some embodiments (one of which is described in greater detail below), cleaning agents that do not attack the metal of the bond-pad 216 can be used to clean the through-hole 364 so that the second passivation layer 354 is not needed to protect the bond-pad 216. One such cleaning agent may include 6% TMAH: propylene glycol for removing laser ablation. Alternatively, in certain other embodiments, the through-hole 364 can remain uncleaned after formation.

Figure 3E:
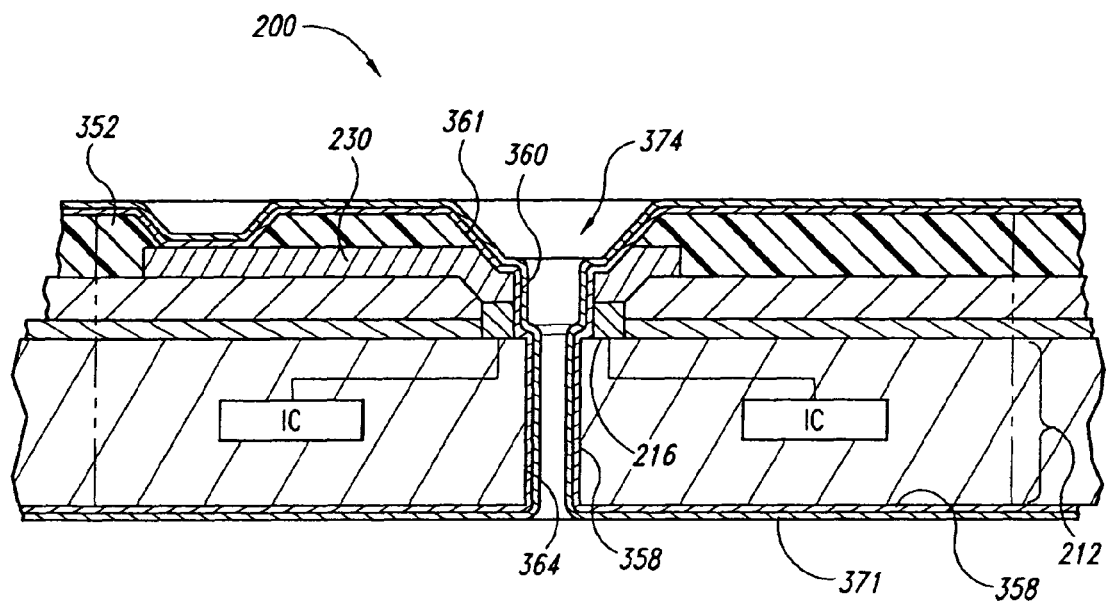

Referring to FIG. 3E, after cleaning the through-hole 364, a fourth passivation layer 358 is applied to the microfeature workpiece 200 to at least cover the portion of the die 212 exposed by the through-hole 364. The fourth passivation layer 358 can be applied in a number of different ways. For example, in the illustrated embodiment, the second and third passivation layers 354, 356 (FIG. 3D) are removed from the microfeature workpiece 200, and the fourth passivation layer 358 is then applied to the entire workpiece so that it covers the exposed portions of the die 212, the bond-pad 216, the conductive line 230, and the second dielectric layer 352. In one aspect of this embodiment, the fourth passivation layer 358 can include a low temperature CVD oxide. In other embodiments, the fourth passivation layer 358 can include other suitable materials. The fourth passivation layer 358 can insulate the die 212 from electrical leakage after the through-hole 364 has been filled with conductive metal (not shown) as described in greater detail below.

After application of the fourth passivation layer 358, a first metal layer 371 is applied to the microfeature workpiece 200. In the illustrated embodiment, the first metal layer 371 covers the entire fourth passivation layer 358. In one aspect of this embodiment, the first metal layer 371 can include $TiCL_4$ TiN. In other embodiments, the first metal layer 371 can include other suitable materials known to those of skill in the art. For ease of reference, the passage formed by the through-hole 364, the first hole 360, and the second hole 361 is referred to herein as a via or passage 374 extending through the microfeature workpiece 200.

Figure 3F:
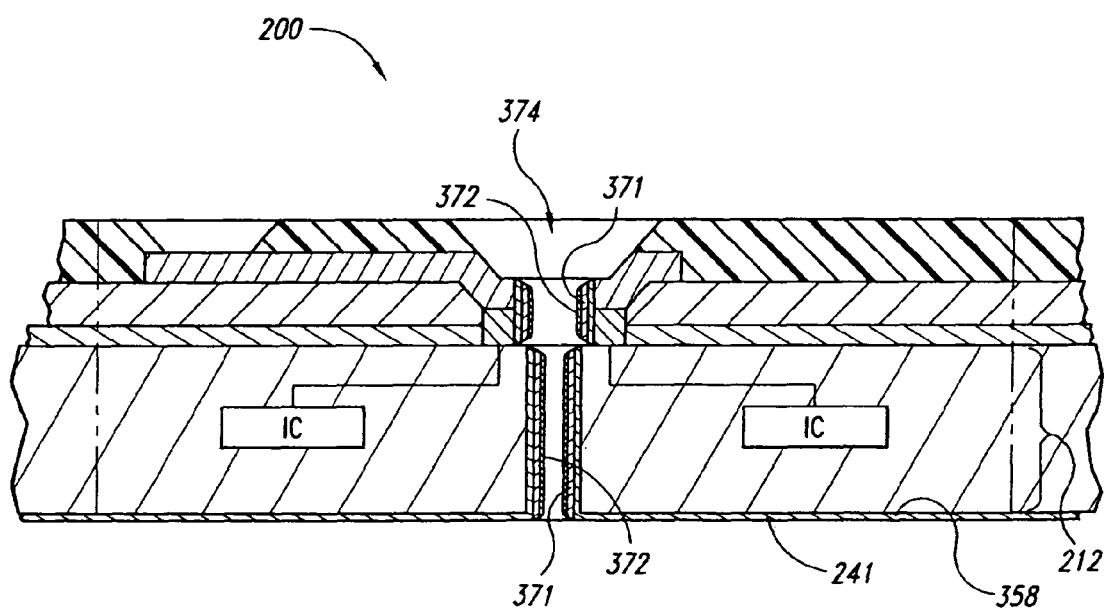

Referring next to FIG. 3F, the first metal layer 371 is removed from the horizontal and diagonal surfaces of the microfeature workpiece 200. The fourth passivation layer 358 is similarly removed from these surfaces, except that it is left on the first surface 241 of the die 212. In one embodiment, the first metal layer 371 and the fourth passivation layer 358 can be removed from these surfaces by a suitable etching process, such as a "dry etch" or "spacer etch" process that only removes material from horizontal surfaces and surfaces having horizontal components. In other embodiments, other processes can be used to remove these layers from the designated surfaces.

After the first metal layer 371 and the fourth passivation layer 358 have been removed from the horizontal and diagonal surfaces of the microfeature workpiece 200 as described above, a second metal layer 372 is applied to the first metal layer 371. The second metal layer 372 can act as a wetting agent to facilitate flowing and/or adhesion of subsequent metals in the passage 374. In one embodiment, for example, the second metal layer 372 can include Ni that is applied over the $TiCL_4$ TiN of the first metal layer 371 in an electroless plating operation. In this embodiment, when the $TiCL_4$ TiN is activated by an HF:Pd wet dip, it provides nucleation for the Ni during the plating process. In other embodiments, the passage 374 can be coated with other suitable materials using other methods or, alternatively, one or more of the first and second metal layers 371, 372 may be omitted.

Figure 3G:
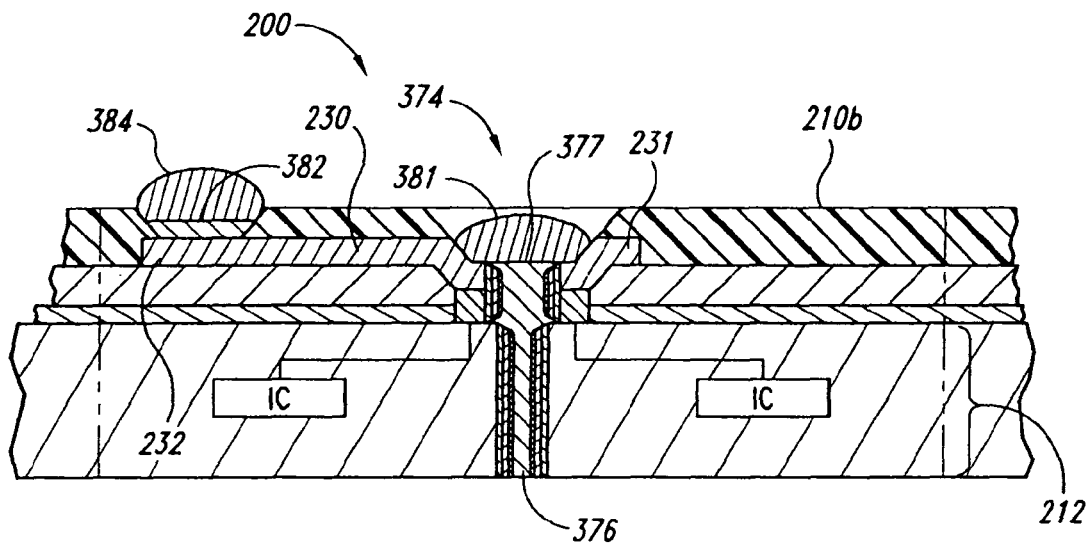

Referring next to FIG. 3G, the passage 374 receives a metal fill 376 to form a conductive interconnect 377 extending through the microelectronic device 210b. In one aspect of this embodiment, the metal fill 376 can include solder or electroplating material. In other embodiments, other electrically conductive materials can be used to fill the passage 374. After filling the passage 374, a first cap 381 can be formed before depositing the fill 376 in the passage 374, or in another embodiment the cap 381 can be applied to the interconnect 377 so that it makes intimate contact with the first end portion 231 of the conductive line 230. A second cap 382 can be applied to the second end portion 232 of the conductive line 230. In one embodiment, the first and second caps 381, 382 can include Ni applied in an electroless plating process. In other embodiments, the first and second caps 381, 382 can include other wetting agents and/or other materials. Alternatively, the first cap 381 and the second cap 382 can be omitted. In another aspect of this embodiment, a solder ball 384 is attached to the second cap 382 to provide an external connection to other electronic devices in a subsequent assembly operation.

In addition to requiring only a single cleaning process for the through-hole 364, another feature of aspects of the embodiments described above with reference to FIGS. 3A-3G is that the passage 374 extends through the entire microfeature workpiece 200. One advantage of this feature is that it makes the passage 374 easier to clean and fill than would otherwise be the case if the passage were "blind" (i.e., a passage that extends only partially through the workpiece). For example, in certain applications where the passage 374 has an aspect ratio of 25-30:1 or greater, a blind passage is difficult to fill with metallic materials using known physical vapor deposition (PVD), atomic level deposition (ALD), or plating processes. The passage 374 mitigates this problem.

Figure 4:
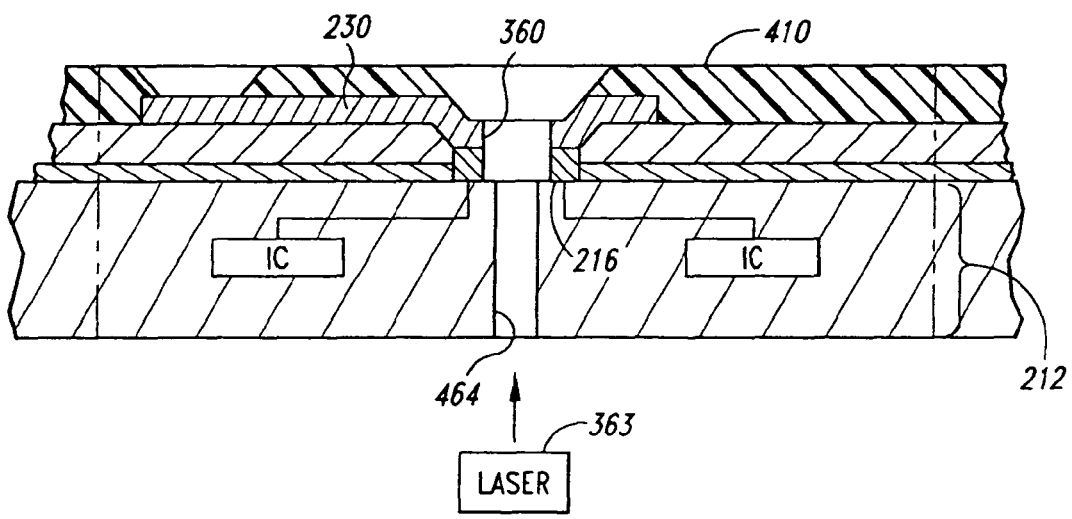
FIG. 4 is a schematic cross-sectional view illustrating a stage in a method of forming a conductive interconnect in a microelectronic device in accordance with another embodiment of the invention.

FIGS. 4 illustrates a stage in a method of forming a conductive interconnect in a microelectronic device 410 in accordance with another embodiment of the invention. In one aspect of this embodiment, the first part of this method is at least generally similar to the steps described above with reference to FIGS. 3A-3B, and results in the workpiece configuration illustrated in FIG. 3B. The second part of this method, however, differs from that described above with reference to FIGS. 3C-3G in that no passivation is deposited into the first hole 360 before the laser 363 cuts a through-hole 464 through the die 212. Instead, the through-hole 464 is cut and cleaned in the absence of any protection over the exposed metal of the bond-pad 216 and the conductive line 230. In the absence of such protection, the cleaning agents may be limited to those chemistries that do not attack or otherwise degrade the metal of the bond-pad 216 or the conductive line 230. For example, in one embodiment, such cleaning agents can include tetramethylammonium hydroxide (TMAH). In other embodiments, other cleaning agents can be used to clean the through-hole 464. After the through-hole 464 has been suitably cleaned, the microelectronic device 410 can undergo additional packaging steps that are at least generally similar to those described above with reference to FIGS. 3E-3G to arrive at the configuration illustrated in FIG. 3G.

Figure 5A:
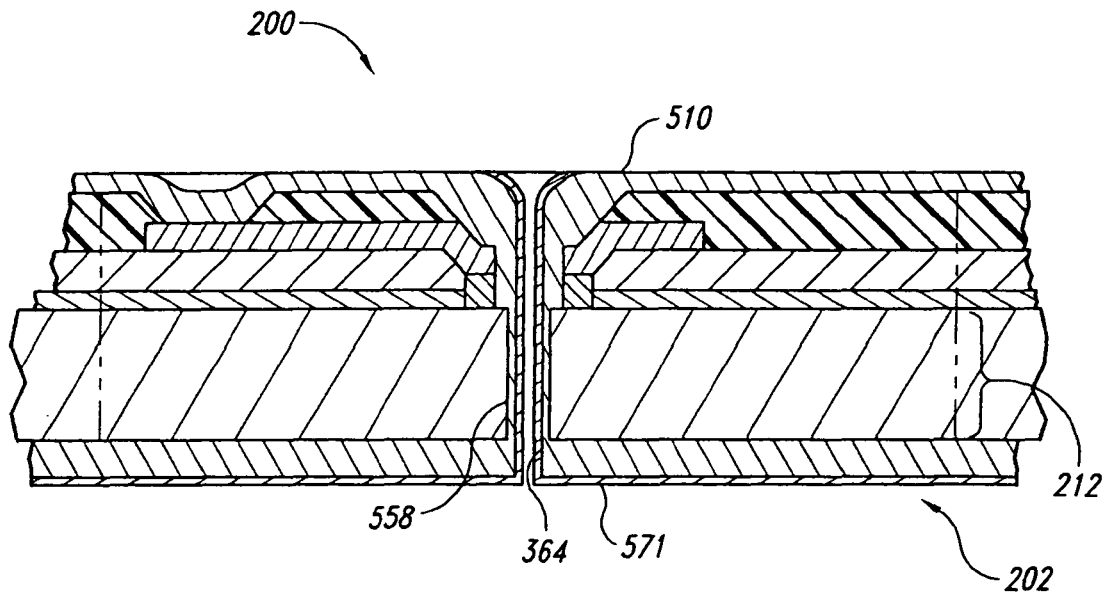
FIGS. 5A-5C are schematic cross-sectional views illustrating various stages in a method of forming a conductive interconnect in a microelectronic device in accordance with a further embodiment of the invention.
Figure 5B:
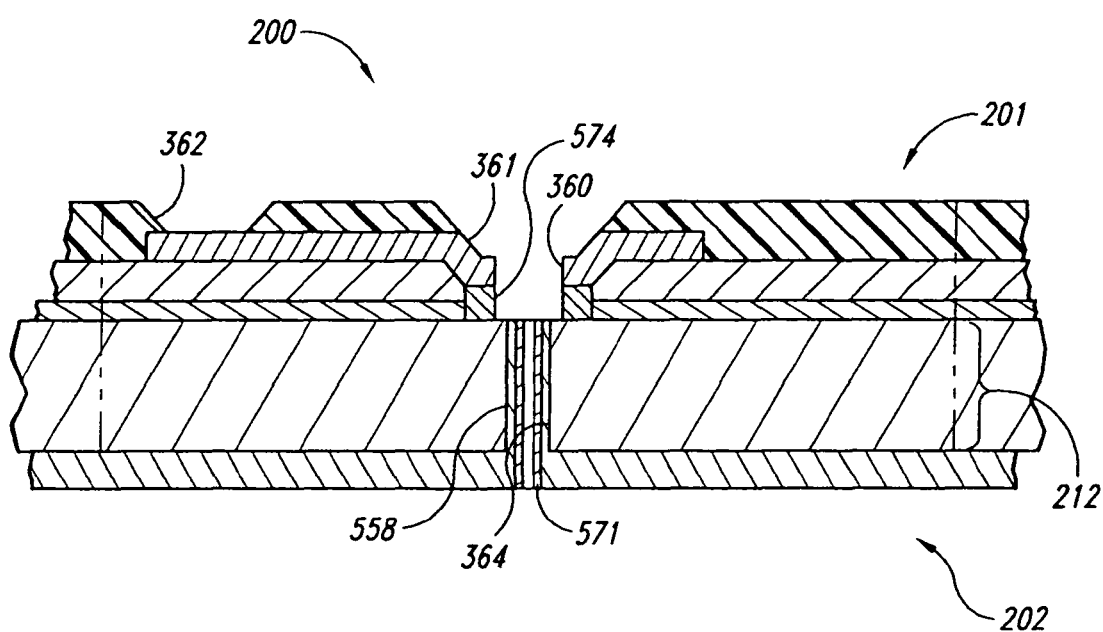
Figure 5C:
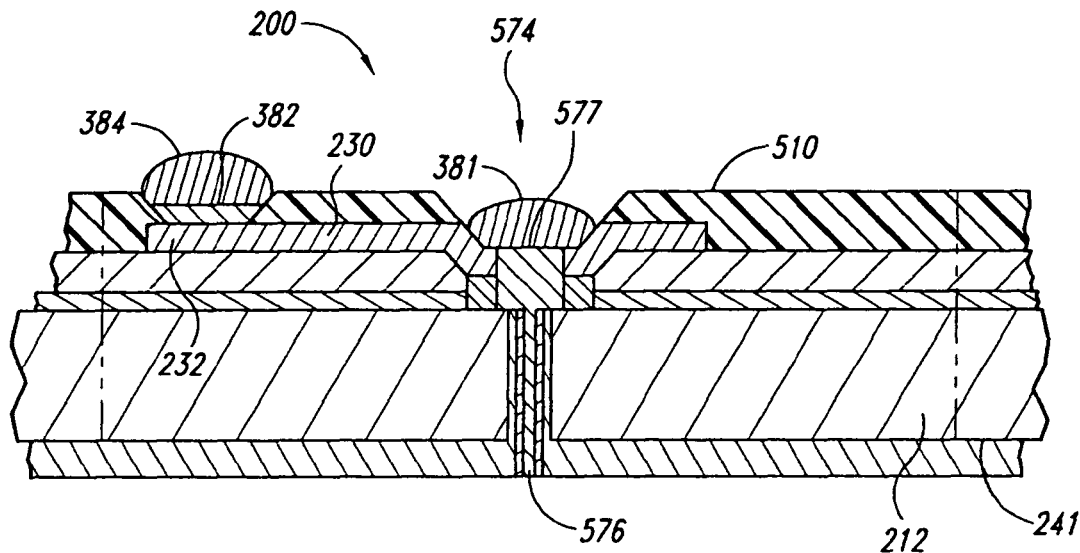

FIGS. 5A-5C illustrate various stages in a method of forming a conductive interconnect in a microelectronic device 510 in accordance with another embodiment of the invention. Referring first to FIG. 5A, the first part of this method can be at least generally similar to the steps described above with reference to FIGS. 3A-3D to arrive at the workpiece configuration illustrated in FIG. 3D. In a further aspect of this embodiment, however, an additional passivation layer 558 is applied to the portion of the die 212 left exposed by the through-hole 364. In addition, after the passivation layer 558 has been applied, a first metal layer 571 is applied to the through-hole 364 and to the back side 202 of the microfeature workpiece 200. In one embodiment, the first metal layer 571 can include $TiCL_4$ TiN. In other embodiments, the first metal layer 571 can include other suitable materials.

Referring next to FIG. 5B, the first metal layer 571 is removed from the back side 202 of the microfeature workpiece 200, leaving the passivation layer 558 covering this surface. Additionally, the first metal layer 571 and the second passivation layer 354 (FIG. 3D) are removed from the front side 201 of the microfeature workpiece 200 to expose the first hole 360, the second hole 361, and the third hole 362. The portions of the passivation layer 558 and the first metal layer 571 in the through-hole 364 remain after the other layers have been removed to insulate the die 212 from electrical leakage during use. For ease of reference, the passage formed by the through-hole 364, the first hole 360, and the second hole 361 is referred to herein as a via or passage 574 extending through the microfeature workpiece 200.

Referring next to FIG. 5C, the passage 574 receives a metal fill 576 to form a conductive interconnect 577 extending through the microelectronic device 510. In one aspect of this embodiment, the interconnect 577 can include solder or electroplating material. In other embodiments, other electrically conductive materials can be used to fill the passage 574. After filling the passage 574, the first cap 381 can be applied to the interconnect 577, and the second cap 382 can be applied to the second end portion 232 of the conductive line 230 to receive the solder ball 384.

The embodiments described above with reference to FIGS. 3A-5C include three methods forming and/or filling through-holes in microfeature workpieces that extend through bond-pads and/or associated RDLs. In other embodiments, other methods can be used to form and/or fill such through-holes. Accordingly, the present invention is not limited to the particular filling methods described above, but extends to other methods for providing a conductive material in a through-hole formed in accordance with the present invention.

Figure 6:
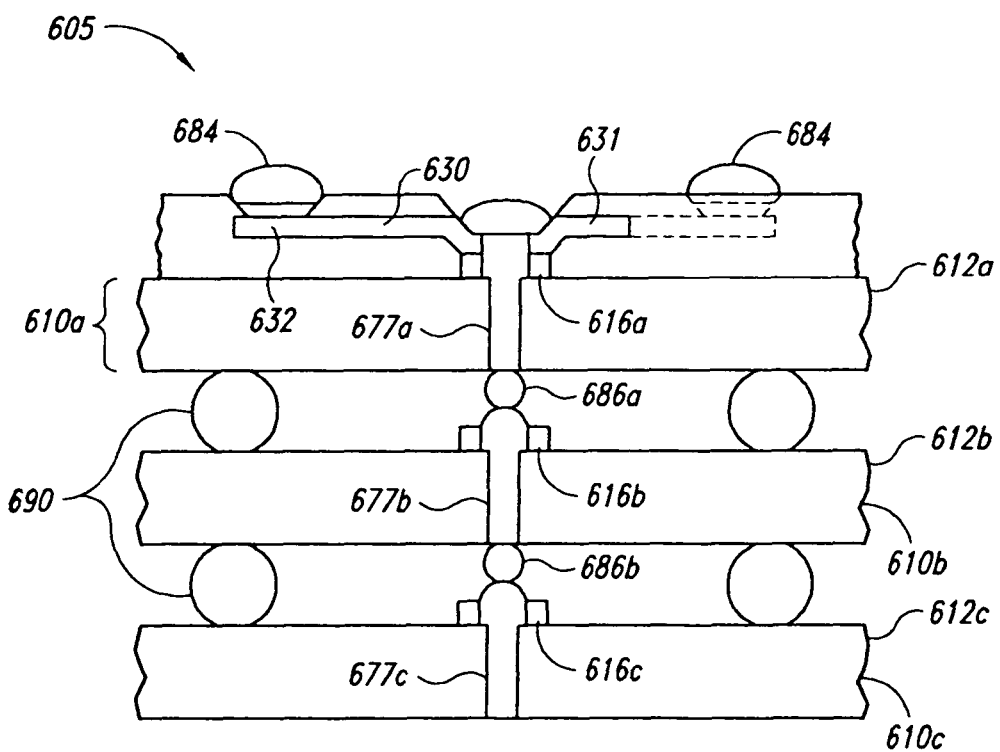
FIG. 6 is a schematic side cross-sectional view of a microelectronic device set configured in accordance with an embodiment of the invention.

FIG. 6 is a schematic side cross-sectional view of a microelectronic device set 605 configured in accordance with an embodiment of the invention. In one aspect of this embodiment, the microelectronic device set 605 includes a plurality of microelectronic devices 610 (individually identified as a first microelectronic device 610a, a second microelectronic device 610b, and a third microelectronic device 610c) interconnected in a stacked-die arrangement. The first microelectronic device 610a can be at least generally similar to the packaged microelectronic devices 210b and 510 discussed above and illustrated in FIGS. 3G and 5C, respectively. Accordingly, the first microelectronic device 610a can include a plurality of interconnects 677a extending through a die 612a, corresponding bond-pads 616a, and corresponding first end portions 631 of conductive lines 630. In addition, the first microelectronic device 610a can further include solder balls 684 deposited on second end portions 632 of the conductive lines 630 for electrically connecting the microelectronic device set 605 to other electronic devices. The second and third microelectronic devices 610b-c can similarly include interconnects 677b-c extending through dies 612b-c and bond-pads 616b-c, respectively.

In another aspect of this embodiment, first solder balls 686a can be used to electrically connect the first microelectronic device 610a to the second microelectronic device 610b, and second solder balls 686b can in turn be used to electrically connect the second microelectronic device 610b to the third microelectronic device 610c. A suitable adhesive 690 or other compound can also be used to structurally attach the microelectronic devices 610 together in the illustrated stacked-die configuration.

Figure 7:
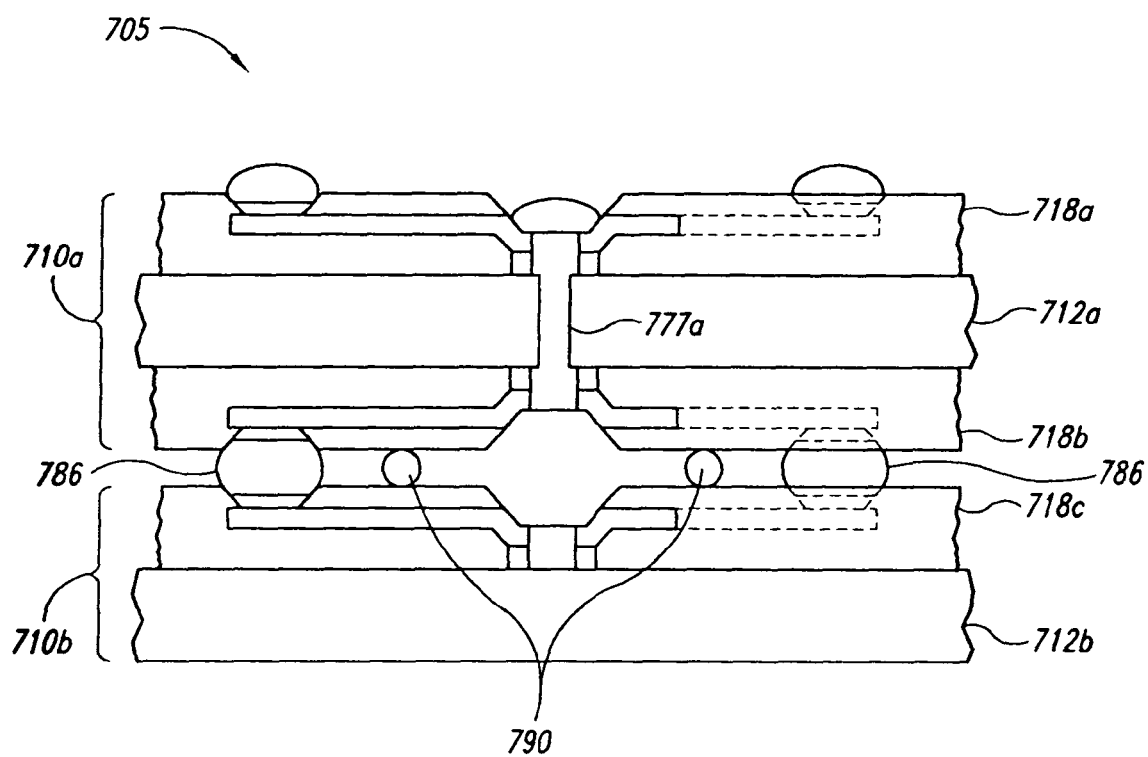
FIG. 7 is a schematic side cross-sectional view of a microelectronic device set configured in accordance with another embodiment of the invention.

FIG. 7 is a schematic side cross-sectional view of a microelectronic device set 705 configured in accordance with an embodiment of the invention. In one aspect of this embodiment, the microelectronic device set 705 includes a plurality of microelectronic devices 710 (individually identified as a first microelectronic device 710a and a second microelectronic device 710b) interconnected in a stacked-die arrangement. Aspects of the first microelectronic device 710a can be at least generally similar to corresponding aspects of the microelectronic devices 210b and 510 discussed above and illustrated in FIGS. 3G and 5C, respectively. For example, the first microelectronic device 710a can include a top or first RDL 718a disposed on a first surface of a die 712a, and a bottom or second RDL 718b disposed on a second surface of the die 712a. A plurality of interconnects 777a extend through the die 712a interconnecting the first RDL 718a to the second RDL 718b. The second microelectronic device 710b similarly includes a third RDL 718c disposed on a surface of a second die 712b.

In another aspect of this embodiment, solder balls 786 can be used to electrically connect the second RDL 718b of the first microelectronic device 710a to the third RDL 718c of the second microelectronic device 710b. Additionally, a suitable adhesive 790 or other compound can also be used to structurally attach the microelectronic devices 710 together in the illustrated stacked-die configuration.

One feature of aspects of the embodiments illustrated in FIGS. 6 and 7 is that the respective microelectronic devices 610, 710 are electrically connected without the need for wire-bonds. One advantage of this feature is that the added cost and complexity of wire-bonds is avoided. A further advantage of this feature is that the footprint of the microelectronic device sets 605, 705 can be reduced over comparable device sets having wire-bond interconnections.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A packaged microelectronic device comprising:
   a die having a first surface, a second surface opposite to the first surface, and an integrated circuit positioned at least partially between the first and second surfaces;
   a bond-pad positioned at least proximate to the second surface of the die and coupled to the integrated circuit, the bond-pad having a third surface at least generally opposite to the first surface of the die;
   a redistribution layer positioned at least proximate to the second surface of the die, the redistribution layer having a conductive line with a first end portion attached to the bond-pad and a second end portion spaced apart from the bond-pad;
   a conductive cap attached to the second end portion of the conductive line and spaced apart from the bond-pad;
   a passage extending completely through the die, the bond-pad, and the first end portion of the conductive line; and
   electrically conductive material that fills the passage from at least proximate to the first surface of the die to at least proximate to the third surface of the bond-pad, wherein the electrically conductive material extends through the bond-pad and contacts the bond-pad.

2. The packaged microelectronic device of claim 1 wherein the electrically conductive material contacts the bond-pad and the first end portion of the conductive line.

3. The packaged microelectronic device of claim 1 wherein the conductive cap includes a ball-pad disposed on the second end portion of the conductive line.

4. The packaged microelectronic device of claim 1, further comprising an insulative layer disposed in the passage between the die and the electrically conductive material.

5. A microfeature workpiece having a front side and a back side opposite to the front side, the microfeature workpiece comprising:
   a die having an integrated circuit;
   a bond-pad electrically coupled to the integrated circuit, wherein the bond-pad includes a through-hole having an inner sidewall;
   a redistribution layer disposed on the die toward the front side of the microfeature workpiece, wherein the redistribution layer includes a conductive line having a first end portion attached to the bond-pad and a second end portion spaced apart from the bond-pad;
   a cap attached to the second end portion of the conductive line and spaced apart from the bond-pad;
   a passage extending through the microfeature workpiece from the back side to the front side and passing completely through the die, the bond-pad, and the conductive line; and
   a metal fill at least partially disposed in the passage and electrically coupled to the bond-pad and the conductive line, wherein the metal fill contacts the inner sidewall of the through-hole in the bond-pad.

6. The microfeature workpiece of claim 5 wherein the metal fill contacts the conductive line.

7. The microfeature workpiece of claim 5 wherein the cap includes a ball-pad disposed on the second end portion of the conductive line and spaced apart from the bond-pad.

8. A microelectronic device set comprising:
a first microelectronic device having:
   a first die with a first integrated circuit and a first bond-pad electrically coupled to the first integrated circuit;
   a redistribution layer disposed on the first die, wherein the redistribution layer includes a conductive line attached to the first bond-pad;
   a passage extending completely through the first die, the first bond-pad, and the conductive line; and
   a metal fill that fills the portion of the passage extending through the first die, wherein the metal fill is electrically coupled to the first bond-pad and the conductive line, and wherein the metal fill contacts the first bond-pad;
at least a second microelectronic device having a second die with a second integrated circuit and a second bond-pad electrically coupled to the second integrated circuit, wherein the second bond-pad is electrically coupled to the metal fill disposed in the passage of the first microelectronic device; and
wherein the conductive line has a first end portion attached to the first bond-pad and a second end portion positioned outward of the first end portion, wherein the second end portion is configured to receive electrical signals and transmit the signals to at least the first integrated circuit of the first die and the second integrated circuit of the second die.

9. The microelectronic device set of claim 8 wherein the first microelectronic device is attached to the second microelectronic device in a stacked-die arrangement.

10. The microelectronic device set of claim 8, further comprising a solder ball disposed between the metal fill of the first microelectronic device and the second bond-pad of the second microelectronic device to electrically couple the metal fill to the second bond-pad.

11. The microelectronic device set of claim 8 wherein the passage is a first passage and the metal fill is a first metal fill, wherein the second microelectronic device further includes a second passage extending through the second die and the second bond-pad, and a second metal fill at least partially disposed in the second passage and electrically coupled to the second bond-pad.

12. The microelectronic device set of claim 8 wherein the passage is a first passage and the metal fill is a first metal fill, wherein the second microelectronic device further includes a second passage extending completely through the second die and the second bond-pad, and a second metal fill at least partially disposed in the second passage and electrically coupled to the second bond-pad, and further comprising:
   at least a third microelectronic device having a third die with a third integrated circuit and a third bond-pad electrically coupled to the third integrated circuit, wherein the third bond-pad is electrically coupled to the second metal fill disposed in the second passage of the second microelectronic device.

13. The microelectronic device set device of claim 8 wherein the second end portion of the conductive line includes a conductive cap spaced from the first bond-pad.

14. The microelectronic device set device of claim 8 wherein the second end portion of the conductive line includes a ball-pad spaced from the first bond-pad.

15. A packaged microelectronic device comprising:
a die having a first surface, a second surface opposite to the first surface, and an integrated circuit positioned at least partially between the first and second surfaces;
a redistribution layer positioned at least proximate to the first surface of the die, the redistribution layer including a conductive line having a first end portion spaced apart from a second end portion;
a passage extending completely through the die and the first end portion of the conductive line;
a conductive pad attached to the second end portion of the conductive line and spaced apart from the passage and the first end portion of the conductive line; and
electrically conductive material disposed in the passage, wherein a first portion of the electrically conductive material extends through the first end portion of the conductive line and is electrically connected to the first end portion of the conductive line, and wherein a second portion of the electrically conductive material fills the portion of the passage extending between the first and second surfaces of the die and is spaced apart from the conductive line.

16. The packaged microelectronic device of claim 15 wherein at least a portion of the electrically conductive material disposed in the passage contacts the first end portion of the conductive line.

17. The packaged microelectronic device of claim 15 wherein the first end portion of the conductive line includes a hole at least partially filled with a passivation material, and wherein the passage extends completely through the die and the passivation material in the hole.

18. The packaged microelectronic device of claim 15 wherein the conductive pad includes a ball-pad disposed on the second end portion of the conductive line.

19. The packaged microelectronic device of claim 15, further comprising an insulative layer disposed in the passage between the die and the electrically conductive material.

20. A packaged microelectronic device comprising:
a die having a first surface, a second surface opposite to the first surface, and an integrated circuit positioned at least partially between the first and second surfaces;
a bond-pad positioned at least proximate to the second surface of the die and coupled to the integrated circuit, the bond-pad having a third surface at least generally opposite to the first surface of the die;
a conductive line formed from a first electrically conductive material and positioned at least proximate to the second surface of the die, the conductive line having a first end portion attached to the bond-pad and a second end portion spaced apart from the bond-pad;
a passage extending completely through the die, the bond-pad, and the first end portion of the conductive line; and
a second electrically conductive material, different from the first electrically conductive material, disposed in the passage from at least proximate to the first surface of the die to at least proximate to the third surface of the bond-pad, wherein the second electrically conductive material extends through the bond-pad and contacts the bond-pad.

21. The packaged microelectronic device of claim 20 wherein the second electrically conductive material contacts the bond-pad and the first end portion of the conductive line.

22. The packaged microelectronic device of claim 20, further comprising an insulative layer disposed in the passage between the die and the second electrically conductive material.

* * * * *